(12) United States Patent
Broyde et al.

(10) Patent No.: US 10,224,901 B2
(45) Date of Patent: Mar. 5, 2019

(54) RADIO COMMUNICATION USING A PLURALITY OF SELECTED ANTENNAS

(71) Applicant: Samsung Electronics Co., Ltd., Suwon-si, Gyeonggi-do (KR)

(72) Inventors: Frédéric Broyde, Maule (FR); Evelyne Clavelier, Maule (FR)

(73) Assignee: Samsung Electronics Co., Ltd., Suwon-si (KR)

( * ) Notice: Subject to any disclaimer, the term of this patent is extended or adjusted under 35 U.S.C. 154(b) by 14 days.

(21) Appl. No.: 14/925,340

(22) Filed: Oct. 28, 2015

(65) Prior Publication Data

US 2016/0049924 A1    Feb. 18, 2016

Related U.S. Application Data

(63) Continuation of application No. PCT/IB2015/052974, filed on Apr. 23, 2015.

(30) Foreign Application Priority Data

May 28, 2014 (FR) ..................... 14 01221

(51) Int. Cl.
    *H01Q 9/00* (2006.01)
    *H03J 1/00* (2006.01)
    (Continued)

(52) U.S. Cl.
    CPC ............. *H03J 1/0008* (2013.01); *H01Q 9/00* (2013.01); *H01Q 21/0006* (2013.01);
    (Continued)

(58) Field of Classification Search
    CPC ... H03J 1/0008; H04B 1/48; H04B 2001/485; H01Q 9/00; H01Q 21/0006
    (Continued)

(56) References Cited

U.S. PATENT DOCUMENTS 2,745,067 A    5/1956    True et al.
4,493,112 A    1/1985    Bruene
(Continued)

FOREIGN PATENT DOCUMENTS

CN    101569055 A    10/2009
FR    2996067 A1     3/2014
(Continued)

OTHER PUBLICATIONS

Chan Wai Po et al, "A Novel Method for Synthesizing an Automatic Matching Network and Its Control Unit", IEEE Transactions on Circuits and Systems—I: Regular Papers, vol. 58, No. 9, pp. 2225-2236, Sep. 2011.

(Continued)

*Primary Examiner* — Hai Tran
(74) *Attorney, Agent, or Firm* — Jefferson IP Law, LLP

(57) ABSTRACT

The invention relates to a method for radio communication using a plurality of antennas, and to an apparatus for radio communication using a plurality of antennas. An apparatus for radio communication of the invention comprises: 4 antennas; a radio device; an antenna tuning apparatus having 2 antenna ports and 2 radio ports; a switching unit comprising 4 input ports each coupled to one of the antennas through a feeder, and 2 output ports, the switching unit operating in an active configuration in which it provides a path between any one of the output ports and one of the input ports, the active configuration being determined by a configuration instruction generated by the radio device; and a tuning control unit, the tuning control unit receiving a tuning instruction generated by the radio device, the tuning control unit delivering a plurality of tuning control signals to the antenna tuning apparatus.

18 Claims, 12 Drawing Sheets

(51) Int. Cl.
*H03H 7/40* (2006.01)
*H04B 1/04* (2006.01)
*H01Q 21/00* (2006.01)
*H04B 1/48* (2006.01)
*H04B 7/06* (2006.01)
*H04B 7/08* (2006.01)

(52) U.S. Cl.
CPC ............ *H03H 7/40* (2013.01); *H04B 1/0458* (2013.01); *H04B 1/48* (2013.01); *H04B 7/0602* (2013.01); *H04B 7/0802* (2013.01); *H04B 2001/485* (2013.01)

(58) Field of Classification Search
USPC ................................................. 343/745, 876
See application file for complete search history.

(56) References Cited

U.S. PATENT DOCUMENTS

| | | | |
|---|---|---|---|
| 7,983,645 B2 * | 7/2011 | Broyde | H04B 7/08 455/273 |
| 8,059,058 B2 | 11/2011 | Lau et al. | |
| 8,204,446 B2 | 6/2012 | Scheer et al. | |
| 2010/0144300 A1 * | 6/2010 | Someya | H01Q 1/273 455/233.1 |
| 2010/0248673 A1 | 9/2010 | Broyde et al. | |
| 2012/0119818 A1 * | 5/2012 | Song | H03K 17/76 327/493 |
| 2013/0267181 A1 | 10/2013 | Ayatollahi et al. | |
| 2014/0323075 A1 * | 10/2014 | Broyde | H04B 7/0874 455/275 |
| 2015/0078485 A1 * | 3/2015 | Broyde | H04B 1/0458 375/297 |
| 2016/0036474 A1 * | 2/2016 | Broyde | H01Q 1/242 455/77 |
| 2016/0043751 A1 * | 2/2016 | Broyde | H01Q 1/52 455/77 |

FOREIGN PATENT DOCUMENTS

| | | |
|---|---|---|
| FR | 2996082 A1 | 3/2014 |
| FR | 3004604 A1 | 10/2014 |
| FR | 3018637 A1 | 9/2015 |
| FR | 3018973 A1 | 9/2015 |
| JP | 2006-166111 A | 6/2006 |
| WO | WO 2008/030165 A1 | 3/2008 |
| WO | WO 2014/049475 A2 | 4/2014 |
| WO | WO 2014/049486 A1 | 4/2014 |
| WO | WO 2014/170766 A1 | 10/2014 |
| WO | WO 2015/136409 A1 | 9/2015 |
| WO | WO 2015/140660 A1 | 9/2015 |

OTHER PUBLICATIONS

Gu et al, "An Analytical Algorithm for Pi-Network Impedance Tuners", IEEE Transactions on Circuits and Systems—I: Regular Papers, vol. 58, No. 12, pp. 2894-2905, Dec. 2011.

Boyle et al, "A Self-Contained Adaptive Antenna Tuner for Mobile Phones", Proceedings of the 6th European Conference on Antenna and Propagation (EUCAP), pp. 1804-1808, Mar. 2012.

Broyde et al, "Some Properties of Multiple-Antenna-Port and Multiple-User-Port Antenna Tuners", IEEE Trans. on Circuits and Systems—I: Regular Papers, vol. 62, No. 2, pp. 423-432, Feb. 2015.

Broyde et al, "A New Multiple-Antenna-Port and Multiple-User-Port Antenna Tuner", proceedings of the 2015 IEEE Radio & Wireless Week, RWW 2015, Jan. 2015.

Petosa, "An Overview of Tuning Techniques for Frequency-Agile Antennas", IEEE Antennas and Propagation Magazine, vol. 54, No. 5, pp. 271-296, Oct. 2012.

Zhang et al, "Adaptive Quad-Element Multi-Wideband Antenna Array for User-Effective LTE MIMO Mobile Terminals", IEEE Trans. on Antennas and Propagation, vol. 61, No. 8, pp. 4275-4283, Aug. 2013.

Search report and written opinion for International Application No. PCT/IB2015/052974.

Taluja et al, "Communication Theory Perspective on Antenna Selection for Compact Transceivers", Proc. 2012 IEEE International Conference on Communications (ICC), pp. 4078-4083, Jun. 2012.

Krewski et al, "Matching Network Synthesis for Mobile MIMO Antennas Based on Minimization of the Total Multi-Port Reflectance", Proc. of the 2011 Loughborough Antenna and Propagation Conference, LAPC 2011, pp. 1-4, Nov. 14-15, 2011.

* cited by examiner

RADIO COMMUNICATION USING A PLURALITY OF SELECTED ANTENNAS

CROSS REFERENCE TO RELATED APPLICATIONS

This is a Continuation Application of PCT application No. PCT/IB2015/052974, filed 23 Apr. 2015, entitled "Radio communication using a plurality of selected antennas", which in turn claims priority to French patent application No. 14/01221 of 28 May 2014, entitled "Communication radio utilisant une pluralité d'antennes sélectionnées", both of which are incorporated herein by reference.

FIELD OF THE INVENTION

The invention relates to a method for radio communication using a plurality of antennas. The invention also relates to an apparatus for radio communication using a plurality of antennas. The received or emitted radio signals may carry information of any nature, for instance signals for speech transmission and/or image transmission (television) and/or data transmission. The received or emitted radio signals may be used for any type of operation, for instance broadcasting, bidirectional point-to-point radio communication or radio communication in a cellular network.

PRIOR ART

The impedance presented by an antenna depends on the frequency and on the electromagnetic characteristics of the volume surrounding the antenna. In particular, if the antenna is built in a portable transceiver, for instance a mobile phone, the body of the user has an effect on the impedance presented by the antenna, and this impedance depends on the position of the body of the user. This is referred to as "user interaction", or "hand effect" or "finger effect".

An antenna tuning apparatus, also referred to as antenna tuner, is a passive apparatus intended to be inserted between a radio device, for instance a radio transmitter or a radio receiver, and its antenna to obtain that the impedance seen by the radio device matches a target value. FIG. 1 shows a block diagram of a typical use of such an antenna tuning apparatus (31) for tuning a single antenna (11), the antenna operating (or being used) in a given frequency band. The antenna tuning apparatus (31) comprises:

- an antenna port (311), the antenna port being coupled to the antenna (11) through a feeder (21), the antenna port (311) seeing, at a frequency in said given frequency band, an impedance referred to as the impedance seen by the antenna port;
- a radio port (312), the radio port being coupled to the radio device (5) through an interconnection (41), the radio port (312) presenting, at said frequency in said given frequency band, an impedance referred to as the impedance presented by the radio port;
- one or more adjustable impedance devices, each of the adjustable impedance devices having a reactance at said frequency in said given frequency band, the reactance of any one of the adjustable impedance devices being adjustable and having an influence on the impedance presented by the radio port.

The radio device (5) is an active equipment for radio communication such as a transmitter, a receiver or a transceiver. The feeder (21) may for instance be a coaxial cable. In some cases, when the antenna tuning apparatus (31) is placed close to the antenna (11), the feeder (21) is not present. The interconnection (41) may for instance be a coaxial cable. In some cases, when the antenna tuning apparatus (31) is placed close to the radio device (5), the interconnection (41) is not present.

An antenna tuning apparatus behaves, at any frequency in the given frequency band, with respect to the antenna port and the radio port, substantially as a passive linear 2-port device. Here, "passive" is used in the meaning of circuit theory, so that the antenna tuning apparatus does not provide amplification. In practice, losses are undesirable for signals applied to the antenna port or the radio port of an antenna tuning apparatus, in the given frequency band. Thus, an ideal antenna tuning apparatus is lossless for signals applied to its antenna port or radio port, in the given frequency band.

FIG. 2 shows a schematic diagram of an antenna tuning apparatus (31) which could be used as shown in FIG. 1 to tune a single antenna, the antenna being used in a given frequency band. The antenna tuning apparatus shown in FIG. 2 comprises:

- an antenna port (311) having two terminals (3111) (3112), the antenna port being single-ended;
- a radio port (312) having two terminals (3121) (3122), the radio port being single-ended; an adjustable impedance device (313) presenting a negative reactance and being coupled in parallel with the antenna port;
- a coil (315);
- an adjustable impedance device (314) presenting a negative reactance and being coupled in parallel with the radio port.

An antenna tuning apparatus of the type shown in FIG. 2 is for instance used in the article of F. Chan Wai Po, E. de Foucault, D. Morche, P. Vincent and E. Kerhervé entitled "A Novel Method for Synthesizing an Automatic Matching Network and Its Control Unit", published in *IEEE Transactions on Circuits and Systems—I: Regular Papers*, vol. 58, No. 9, pp. 2225-2236 in September 2011. The article of Q. Gu, J. R. De Luis, A. S. Morris, and J. Hilbert entitled "An Analytical Algorithm for Pi-Network Impedance Tuners", published in *IEEE Transactions on Circuits and Systems—I: Regular Papers*, vol. 58, No. 12, pp. 2894-2905 in December 2011, and the article of K. R. Boyle, E. Spits, M. A. de Jongh, S. Sato, T. Bakker and A. van Bezooij en entitled "A Self-Contained Adaptive Antenna Tuner for Mobile Phones", published in *Proceedings of the 6th European Conference on Antenna and Propagation (EUCAP)*, pp. 1804-1808 in March 2012, consider an antenna tuning apparatus of a type similar to the one shown in FIG. 2, the main difference being that the coil (315) of FIG. 2 is replaced with an adjustable impedance device, the adjustable impedance device being a variable inductor or an inductor connected in parallel with a variable capacitor.

An antenna tuning apparatus may be used to compensate a variation in the impedance seen by the antenna port, caused by a variation in the frequency of operation, and/or to compensate the user interaction.

The impedance matrix presented by a multiport antenna array depends on the frequency and on the electromagnetic characteristics of the volume surrounding the antennas. In particular, if the multiport antenna array is built in a portable transceiver using multiple antennas simultaneously for MIMO communication, for instance a user equipment (UE) of an LTE wireless network, the impedance matrix presented by the multiport antenna array is affected by the user interaction.

Another antenna tuning apparatus, which may be referred to as "multiple-antenna-port and multiple-radio-port antenna tuning apparatus", is a passive apparatus intended to be inserted between a radio device using multiple antennas simultaneously in a frequency band, for instance a radio transmitter or a radio receiver for MIMO communication, and said multiple antennas, to obtain that the impedance matrix seen by the radio device matches a target value. FIG. 3 shows a block diagram of a typical use of such an antenna tuning apparatus (3) for simultaneously tuning 4 antennas (11) (12) (13) (14), the 4 antennas operating in a given frequency band, the 4 antennas forming an antenna array (1). In FIG. 3, the antenna tuning apparatus (3) comprises:

n=4 antenna ports (311) (321) (331) (341), each of the antenna ports being coupled to one of the antennas (11) (12) (13) (14) through a feeder (21) (22) (23) (24), the antenna ports seeing, at a frequency in said given frequency band, an impedance matrix referred to as the impedance matrix seen by the antenna ports;

m=4 radio ports (312) (322) (332) (342), each of the radio ports being coupled to the radio device (5) through an interconnection (41) (42) (43) (44), the radio ports presenting, at said frequency in said given frequency band, an impedance matrix referred to as the impedance matrix presented by the radio ports;

p adjustable impedance devices, where p is an integer typically greater than or equal to m, each of the adjustable impedance devices having a reactance at said frequency in said given frequency band, the reactance of any one of the adjustable impedance devices being adjustable and having an influence on the impedance matrix presented by the radio ports.

A multiple-antenna-port and multiple-radio-port antenna tuning apparatus behaves, at any frequency in the given frequency band, with respect to the n antenna ports and the m radio ports, substantially as a passive linear (n+m)-port device. Here "passive" is again used in the meaning of circuit theory, so that the multiple-antenna-port and multiple-radio-port antenna tuning apparatus does not provide amplification. In practice, losses are undesirable for signals applied to the antenna ports or the radio ports of a multiple-antenna-port and multiple-radio-port antenna tuning apparatus, in the given frequency band. Thus, an ideal multiple-antenna-port and multiple-radio-port antenna tuning apparatus is lossless for signals applied to its antenna ports or radio ports, in the given frequency band.

FIG. 4 shows a schematic diagram of an antenna tuning apparatus (3) which could be used as shown in FIG. 3 to tune 4 antennas, the antennas being used in a given frequency band. The antenna tuning apparatus shown in FIG. 4 comprises:

n=4 antenna ports (311) (321) (331) (341), each of the antenna ports being single-ended;

m=4 radio ports (312) (322) (332) (342), each of the radio ports being single-ended;

n adjustable impedance devices (301) each presenting a negative reactance and each being coupled in parallel with one of the antenna ports;

n (n−1)/2 adjustable impedance devices (302) each presenting a negative reactance and each having a first terminal coupled to one of the antenna ports and a second terminal coupled to one of the antenna ports which is different from the antenna port to which the first terminal is coupled;

n=m windings (303) each having a first terminal coupled to one of the antenna ports and a second terminal coupled to one of the radio ports;

m adjustable impedance devices (304) each presenting a negative reactance and each being coupled in parallel with one of the radio ports;

m (m−1)/2 adjustable impedance devices (305) each presenting a negative reactance and each having a first terminal coupled to one of the radio ports and a second terminal coupled to one of the radio ports which is different from the radio port to which the first terminal is coupled.

A multiple-antenna-port and multiple-radio-port antenna tuning apparatus of the type shown in FIG. 4 is disclosed in the French patent application number 12/02542 entitled "Appareil d'accord d'antenne pour un réseau d'antennes à accès multiples" and in the corresponding international application PCT/IB2013/058423 (WO 2014/049475) entitled "Antenna tuning apparatus for a multiport antenna array".

A multiple-antenna-port and multiple-radio-port antenna tuning apparatus may be used to compensate a variation in the impedance matrix seen by the antenna ports, caused by a variation in the frequency of operation, and/or to compensate the user interaction.

An antenna tuning apparatus may be such that the reactance value of any one of its adjustable impedance devices is adjusted manually. This type of manual tuning requires a skilled operator, and is for instance implemented to adjust some antenna tuning apparatuses for radio amateurs, having a single antenna port and a single radio port as shown in FIG. 1 and FIG. 2.

An antenna tuning apparatus may be such that the reactance of each of its adjustable impedance devices is adjustable by electrical means. Such an antenna tuning apparatus may be such that the reactance value of any one of its adjustable impedance devices is adjusted automatically or adaptively. In this case, if the antenna tuning apparatus and the circuits providing an automatic or adaptive adjustment of its adjustable impedance devices form a single device, this device may be referred to as "automatic antenna tuning apparatus", or "automatic antenna tuner" or "adaptive antenna tuner".

Automatic antenna tuning has been applied for a long time to an antenna tuning apparatus having a single antenna port and a single radio port, as shown in the patent of the U.S. Pat. No. 2,745,067 entitled "Automatic Impedance Matching Apparatus", and in the patent of the U.S. Pat. No. 4,493,112 entitled "Antenna Tuner Discriminator". Automatic antenna tuning applied to an antenna tuner having a single antenna port and a single radio port is also the subject matter of current research work, some of which is for instance described in said technical articles entitled "A Novel Method for Synthesizing an Automatic Matching Network and Its Control Unit", "An Analytical Algorithm for Pi-Network Impedance Tuners", and "A Self-Contained Adaptive Antenna Tuner for Mobile Phones".

Automatic antenna tuning has recently been applied to a multiple-antenna-port and multiple-radio-port antenna tuning apparatus, as shown in the patent of the U.S. Pat. No. 8,059,058 entitled "Antenna system and method for operating an antenna system", in the French patent application number 12/02564 entitled "Procédé et dispositif pour la réception radio utilisant un appareil d'accord d'antenne et une pluralité d'antennes", corresponding to the international application number PCT/IB2013/058574 (WO 2014/049486) entitled "Method and device for radio reception using an antenna tuning apparatus and a plurality of antennas", and in the French patent application number 13/00878 entitled "Procédé et appareil pour accorder automatiquement une matrice impédance, et émetteur radio utilisant cet appareil", corresponding to the international application number PCT/IB2014/058933 (WO 2014/170766) entitled "Method and apparatus for automatically tuning an impedance matrix, and radio transmitter using this apparatus".

However, an important limitation of the state of the art relating to automatic antenna tuning applied to a multiple-antenna-port and multiple-radio-port antenna tuning apparatus is that a large number of expensive electrically adjustable impedance devices is required.

SUMMARY OF THE INVENTION

The purposes of the invention are a method and an apparatus for radio communication using an antenna tuning apparatus and a plurality of antennas, without the above-mentioned limitations of known techniques.

In what follows, "having an influence" and "having an effect" have the same meaning.

The method of the invention is a method for radio communication with several antennas in a given frequency band, using an apparatus for radio communication that includes N antennas, where N is an integer greater than or equal to 3, each of the N antennas being such that it can operate at any frequency in the given frequency band, the method comprising the steps of:

selecting n antennas among the N antennas, where n is an integer greater than or equal to 2 and less than or equal to N minus 1, using a switching unit comprising N input ports and n output ports, each of the N input ports being coupled, directly or indirectly, to one of the N antennas, the switching unit providing, for signals in the given frequency band and for any one of the n output ports, a path between said any one of the n output ports and one of the input ports, said one of the input ports being coupled to one of the n selected antennas, the n selected antennas being determined by a "configuration instruction";

coupling the n output ports, directly or indirectly, to n antenna ports of an antenna tuning apparatus comprising, in addition to said n antenna ports, m radio ports and p adjustable impedance devices, where m is an integer greater than or equal to 2 and where p is an integer greater than or equal to 2m, the p adjustable impedance devices being referred to as "the adjustable impedance devices of the antenna tuning apparatus" and being such that, at a frequency in said given frequency band, each of the adjustable impedance devices of the antenna tuning apparatus has a reactance, the reactance of any one of the adjustable impedance devices of the antenna tuning apparatus being adjustable by electrical means; and generating a "tuning instruction", the tuning instruction having an effect on the reactance of each of the adjustable impedance devices of the antenna tuning apparatus.

Each of the N antennas has a port, referred to as "the signal port of the antenna", comprising two terminals, which can be used to receive and/or to emit electromagnetic waves. It is assumed that each of said N antennas behaves, at any frequency in the given frequency band, with respect to the signal port of the antenna, substantially as a passive antenna, that is to say as an antenna which is linear and does not use an amplifier for amplifying signals received by the antenna or signals emitted by the antenna. As a consequence of linearity, it is possible to define an impedance matrix presented by the n antennas, the definition of which only considers, for each of the antennas, the signal port of the antenna. This matrix is consequently of size N×N. Because of the interactions between the antennas, this matrix need not be diagonal. In particular, the invention may be such that this matrix is not a diagonal matrix.

Each of the N input ports is coupled, directly or indirectly, to one of the N antennas. More precisely, each of the input ports is coupled, directly or indirectly, to the signal port of one of the N antennas. Additionally, each of the n output ports is coupled, directly or indirectly, to one of the n antenna ports of the antenna tuning apparatus. For instance, an indirect coupling may be a coupling through a feeder and/or through a directional coupler.

Said path between any one of the n output ports and one of the input ports is a signal path. It may be a unidirectional path or a bidirectional path. The antenna tuning apparatus may be used to tune said n selected antennas.

The configuration instruction may comprise any type of electrical signal and/or any combination of such electrical signals. The configuration instruction may be generated automatically within the apparatus for radio communication. The tuning instruction may comprise any type of electrical signal and/or any combination of such electrical signals. The tuning instruction may be generated automatically within the apparatus for radio communication.

An apparatus implementing the method of the invention is an apparatus for radio communication using several antennas in a given frequency band, the apparatus for radio communication comprising:

N antennas, where N is an integer greater than or equal to 3, each of the N antennas being such that it can operate at any frequency in the given frequency band;

a processing unit, the processing unit delivering a "configuration instruction" and a "tuning instruction";

a switching unit comprising N input ports and n output ports, where n is an integer greater than or equal to 2 and less than or equal to N minus 1, each of the N input ports being coupled, directly or indirectly, to one of the N antennas, the switching unit operating in an active configuration determined by the configuration instruction, the active configuration being one of a plurality of allowed configurations, the switching unit providing, in any one of the allowed configurations, for signals in the given frequency band and for any one of the n output ports, a path between said any one of the n output ports and one of the input ports;

an antenna tuning apparatus comprising n antenna ports, m radio ports and p adjustable impedance devices, where m is an integer greater than or equal to 2 and where p is an integer greater than or equal to 2m, the p adjustable impedance devices being referred to as "the adjustable impedance devices of the antenna tuning apparatus" and being such that, at a frequency in said given frequency band, each of the adjustable impedance devices of the antenna tuning apparatus has a reactance, the reactance of any one of the adjustable impedance devices of the antenna tuning apparatus being adjustable by electrical means, the n output ports being coupled, directly or indirectly, to the n antenna ports; and a tuning control unit, the tuning control unit receiving the tuning instruction, the tuning control unit delivering a plurality of "tuning control signals", the tuning control signals being determined as a function of the tuning instruction, the reactance of each of the adjustable impedance devices of the antenna tuning apparatus being mainly determined by one or more of the tuning control signals.

The switching unit operates (or is used) in an active configuration determined by the configuration instruction, the active configuration being one of a plurality of allowed configurations, the switching unit providing, in any one of the allowed configurations, for signals in the given frequency band and for any one of the output ports, a path between said any one of the output ports and one of the input ports. Thus, the switching unit operates in an active configuration which is one of the allowed configurations, and each allowed configuration corresponds to a selection of n input ports among the N input ports. It is also possible to say that the switching unit operates in an active configuration corresponding to a selection of n input ports among the N input ports.

Each allowed configuration corresponds to a selection of n input ports among the N input ports, the switching unit providing, for signals in the given frequency band and for any one of the output ports, a path between said any one of the output ports and one of the selected input ports. This path may preferably be a low loss path for signals in the given frequency band. The specialist understands that a suitable switching unit may comprise one or more electrically controlled switches and/or change-over switches (here, "electrically controlled" means "controlled by electrical means"). In this case, one or more of said electrically controlled switches and/or change-over switches may for instance be an electro-mechanical relay, or a microelectromechanical switch (MEMS switch), or a circuit using one or more PIN diodes and/or one or more insulated-gate field-effect transistors (MOSFETs) as switching devices.

The radio ports present, at said frequency in said given frequency band, an impedance matrix referred to as "the impedance matrix presented by the radio ports", and the antenna ports see, at said frequency in said given frequency band, an impedance matrix referred to as "the impedance matrix seen by the antenna ports". It is assumed that said antenna tuning apparatus behaves, at any frequency in the given frequency band, with respect to its antenna ports and its radio ports, substantially as a passive linear device (where "passive" is used in the meaning of circuit theory). More precisely, said antenna tuning apparatus behaves, at any frequency in the given frequency band, with respect to the n antenna ports and the m radio ports, substantially as a passive linear (n+m)-port device. As a consequence of linearity, it is possible to define the impedance matrix presented by the radio ports. As a consequence of passivity, the antenna tuning apparatus does not provide amplification.

An adjustable impedance device is a component comprising two terminals which substantially behave as a passive linear two-terminal circuit element, and which are consequently fully characterized by an impedance which may depend on frequency, this impedance being adjustable. An adjustable impedance device may be adjustable by mechanical means, for instance a variable resistor, a variable capacitor, a network comprising a plurality of capacitors and one or more switches or change-over switches used to cause different capacitors of the network to contribute to the reactance, a variable inductor, a network comprising a plurality of inductors and one or more switches or change-over switches used to cause different inductors of the network to contribute to the reactance, or a network comprising a plurality of open-circuited or short-circuited stubs and one or more switches or change-over switches used to cause different stubs of the network to contribute to the reactance. We note that all examples in this list, except the variable resistor, are intended to provide an adjustable reactance.

An adjustable impedance device having a reactance which is adjustable by electrical means may be such that it only provides, at said frequency in said given frequency band, a finite set of reactance values, this characteristic being for instance obtained if the adjustable impedance device is:
- a network comprising a plurality of capacitors or open-circuited stubs and one or more electrically controlled switches or change-over switches, such as electro-mechanical relays, or microelectromechanical switches (MEMS switches), or PIN diodes or insulated-gate field-effect transistors (MOSFETs), used to cause different capacitors or open-circuited stubs of the network to contribute to the reactance; or
- a network comprising a plurality of coils or short-circuited stubs and one or more electrically controlled switches or change-over switches used to cause different coils or short-circuited stubs of the network to contribute to the reactance.

An adjustable impedance device having a reactance which is adjustable by electrical means may be such that it provides, at said frequency in said given frequency band, a continuous set of reactance values, this characteristic being for instance obtained if the adjustable impedance device is based on the use of a variable capacitance diode; or a MOS varactor; or a microelectromechanical varactor (MEMS varactor); or a ferroelectric varactor.

The antenna tuning apparatus may be such that the reactance of any one of the adjustable impedance devices of the antenna tuning apparatus has, at said frequency in said given frequency band, if the impedance matrix seen by the antenna ports is equal to a given diagonal impedance matrix, an influence on the impedance matrix presented by the radio ports. This must be interpreted as meaning: the antenna tuning apparatus may be such that, at said frequency in said given frequency band, there exists a diagonal impedance matrix referred to as the given diagonal impedance matrix, the given diagonal impedance matrix being such that, if the impedance matrix seen by the antenna ports is equal to the given diagonal impedance matrix, then the reactance of any one of the adjustable impedance devices of the antenna tuning apparatus has an influence on the impedance matrix presented by the radio ports.

The method of the invention may further comprise the step of controlling one or more characteristics of at least one of the antennas, using at least one antenna control device, said at least one antenna control device being a part of said at least one of the antennas, said at least one antenna control device having at least one parameter having an influence on said one or more characteristics, said at least one parameter being adjustable by electrical means, the tuning instruction having an effect on each of said parameters. In the previous sentence, "each of said parameters" clearly means "each said at least one parameter of each said at least one antenna control device of each said at least one of the antennas". Each of said at least one of the antennas comprises two terminals of said signal port of the antenna, and at least one antenna control device, which may comprise one or more other terminals used for other electrical connections.

Each of said one or more characteristics may for instance be an electrical characteristic such as an impedance at a specified frequency, or an electromagnetic characteristic such as a directivity pattern at a specified frequency. Each of said at least one of the antennas comprises at least one antenna control device having at least one parameter having an effect on one or more characteristics of said each of said at least one of the antennas, said at least one parameter being adjustable by electrical means. Thus, the specialist understands that each of said at least one of the antennas is a tunable passive antenna. A tunable passive antenna may also be referred to as "reconfigurable antenna". Some authors consider three classes of tunable passive antennas: polarization-agile antennas, pattern-reconfigurable antennas and frequency-agile antennas. The state of the art regarding frequency-agile antennas is for instance described in the article of A. Petosa entitled "An Overview of Tuning Techniques for Frequency-Agile Antennas", published in *IEEE Antennas and Propagation Magazine*, vol. 54, No. 5, in October 2012.

The apparatus implementing the method of the invention may be such that at least one tunable passive antenna is among said N antennas, said at least one tunable passive antenna comprising at least one antenna control device, one or more characteristics of said at least one tunable passive antenna being controlled using said at least one antenna control device, said at least one antenna control device having at least one parameter having an influence on said one or more characteristics, said at least one parameter being adjustable by electrical means, each of said parameters being mainly determined by one or more of the tuning control signals. In the previous sentence, "each of said parameters" clearly means "each said at least one parameter of each said at least one antenna control device of each said at least one tunable passive antenna".

As explained in said article of A. Petosa, many different types of antenna control device may be used to control one or more characteristics of any one of the tunable passive antennas. A suitable antenna control device may for instance be:
 an electrically controlled switch or change-over switch, in which case a parameter of the antenna control device having an influence on one or more characteristics of the tunable passive antenna may be the state of the switch or change-over switch;
 an adjustable impedance device, in which case a parameter of the antenna control device having an influence on one or more characteristics of the tunable passive antenna may be the reactance or the impedance of the adjustable impedance device at a specified frequency; or
 an actuator arranged to produce a mechanical deformation of the tunable passive antenna, in which case a parameter of the antenna control device having an influence on one or more characteristics of the tunable passive antenna may be a length of the deformation.

If an antenna control device is an electrically controlled switch or change-over switch, it may for instance be an electro-mechanical relay, or a microelectromechanical switch (MEMS switch), or a circuit using one or more PIN diodes and/or one or more insulated-gate field-effect transistors (MOSFETs) as switching devices.

BRIEF DESCRIPTION OF THE DRAWINGS

Other advantages and characteristics will appear more clearly from the following description of particular embodiments of the invention, given by way of non-limiting examples, with reference to the accompanying drawings in which.

DETAILED DESCRIPTION OF SOME EMBODIMENTS

First Embodiment

Figure 5:
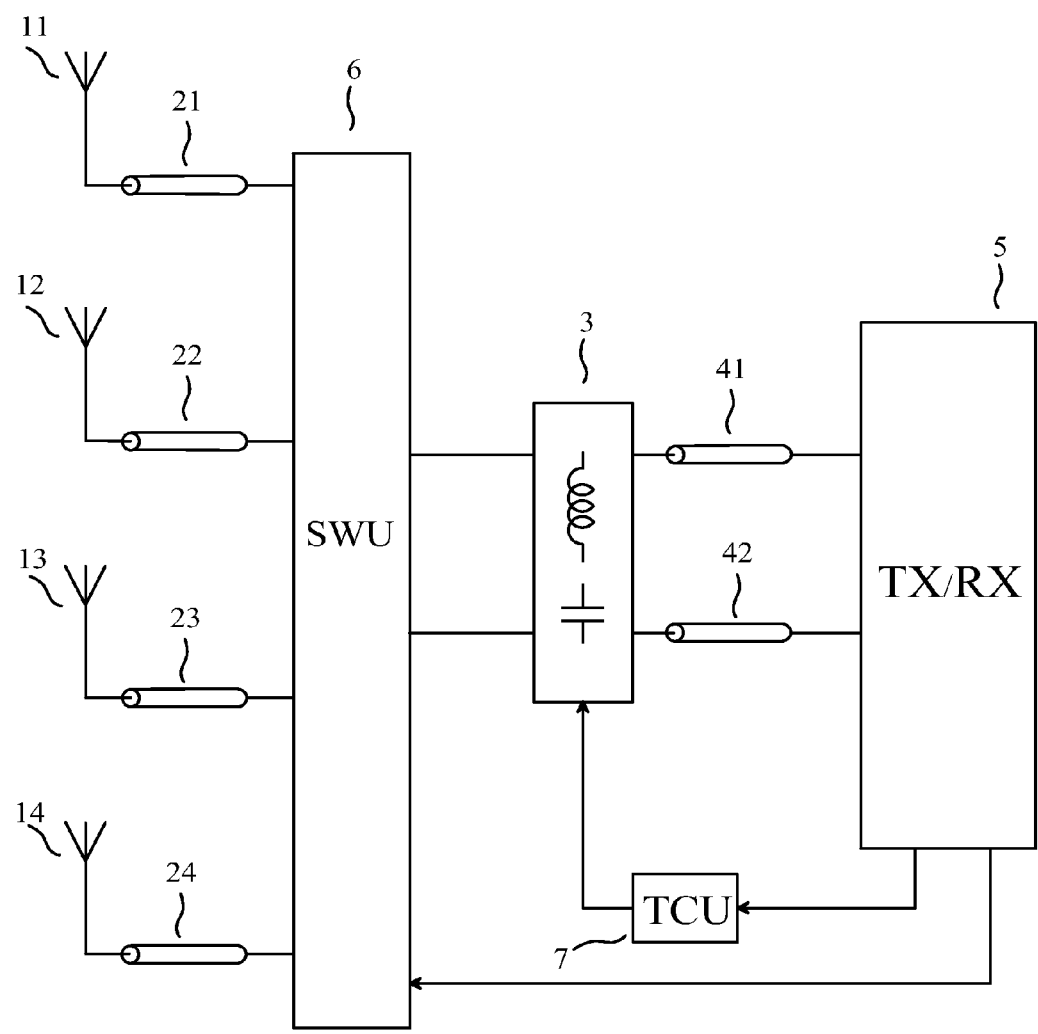
FIG. 5 shows a block diagram of a transceiver for radio communication of the invention, which simultaneously uses 2 selected antennas among 4 antennas.

As a first embodiment of an apparatus of the invention, given by way of non-limiting example, we have represented in FIG. 5 the block diagram of a portable apparatus for radio communication in a given frequency band, the apparatus for radio communication being a transceiver comprising:
 N=4 antennas (11) (12) (13) (14), each of the N antennas being such that it can operate at any frequency in the given frequency band;
 a radio device (5) which consists of all parts of the apparatus for radio communication which are not shown elsewhere in FIG. 5;
 a switching unit (6), the switching unit receiving a "configuration instruction" generated automatically within the apparatus for radio communication, the switching unit comprising N input ports each coupled to one and only one of the antennas through a feeder (21) (22) (23) (24), the switching unit comprising n=2 output ports, the switching unit operating in an active configuration determined by the configuration instruction, the active configuration being one of a plurality of allowed configurations, any one of the allowed configurations corresponding to a selection of n input ports among the N input ports, the switching unit providing, for any small signal in the given frequency band and for any one of the output ports, a bidirectional path between said any one of the output ports and one and only one input port of said selection of n input ports;

an antenna tuning apparatus (3), the antenna tuning apparatus being a multiple-antenna-port and multiple-radio-port antenna tuning apparatus, the antenna tuning apparatus comprising n=2 antenna ports, each of the output ports being coupled to one and only one of the antenna ports, the antenna tuning apparatus comprising m=2 radio ports, each of the radio ports being coupled to the radio device (5) through an interconnection (41) (42), the antenna tuning apparatus comprising p adjustable impedance devices, where p is an integer greater than or equal to 2m, the p adjustable impedance devices being referred to as "the adjustable impedance devices of the antenna tuning apparatus" and being such that, at a frequency in said given frequency band, each of the adjustable impedance devices of the antenna tuning apparatus has a reactance, the reactance of any one of the adjustable impedance devices of the antenna tuning apparatus being adjustable by electrical means; and a tuning control unit (7), the tuning control unit receiving a "tuning instruction" generated automatically within the apparatus for radio communication, the tuning control unit delivering a plurality of "tuning control signals" to the antenna tuning apparatus (3), the tuning control signals being determined as a function of the tuning instruction, the reactance of each of the adjustable impedance devices of the antenna tuning apparatus being mainly determined by one or more of the tuning control signals.

Since each of the N input ports is coupled to one and only one of the antennas through a feeder and since each allowed configuration corresponds to a selection of n input ports among the N input ports, it is possible to say that each allowed configuration corresponds to a selection of n antennas among the N antennas. Thus, it is possible to say that the switching unit is used to select n antennas among the N antennas, the switching unit providing, for signals in the given frequency band and for any one of the output ports, a path between said any one of the output ports and one and only one of the input ports, said one and only one of the input ports being coupled to one and only one of the n selected antennas, the n selected antennas being determined by the configuration instruction.

The specialist understands that it is possible to consider that the N antennas (11) (12) (13) (14) operate simultaneously in the given frequency band and form an antenna array having N ports. Any one of the allowed configurations is such that n antennas among the N antennas are selected in said any one of the allowed configurations. Consequently, n antennas among the N antennas are selected in the active configuration. Thus, the specialist understands that it is also possible to consider that the N antennas (11) (12) (13) (14), the feeders (21) (22) (23) (24) and the switching unit (6) form an antenna array having n ports, whose characteristics are controlled by electrical means. Because of the interactions between the N antennas, each of the antennas which is not selected in the active configuration has an influence on the characteristics of the n-port antenna array formed by the N antennas (11) (12) (13) (14), the feeders (21) (22) (23) (24) and the switching unit (6).

The configuration instruction and the tuning instruction are generated repeatedly by the radio device (5), more precisely by a processing unit which is a part of the radio device. For instance, the configuration instruction and the tuning instruction may be generated periodically, for instance every 10 milliseconds. The configuration instruction and the tuning instruction are such that, at the frequency of operation, the impedance matrix presented by the radio ports is close to a specified matrix.

The tuning instruction is a function of the configuration instruction and of one or more variables or quantities such as: information on the efficiency of one or more of the antennas, information on isolation between antennas, one or more operational factors of the apparatus for radio communication, and/or one or more performance metrics of the apparatus for radio communication. The specialist knows how to obtain and use such one or more variables or quantities. The following eighth, ninth, tenth, eleventh and twelfth embodiments are examples in which such one or more variables or quantities are obtained and used. Thus, the specialist understands how the tuning instruction can be determined as a function of said one or more variables or quantities, taking into account the configuration instruction, the interactions between the antennas and the characteristics of the antenna tuning apparatus.

The specified matrix is such that the impedance matrix seen by the radio device (5) approximates an arbitrary wanted matrix. The specified matrix may for instance be a diagonal matrix. The specialist understands that this overcomes the above-mentioned limitations of known techniques, because, in this first embodiment, a multiple-antenna-port and multiple-radio-port antenna tuning apparatus having only n=2 antenna ports and m=2 radio ports is used, so that a large number of expensive electrically adjustable impedance devices is not required, and because the impedance matrix seen by the radio device approximates an arbitrary wanted matrix.

Another difference between the invention and the prior art is that any one of the signal ports of the antennas is not permanently coupled, directly or through a feeder, to one of the antenna ports of the multiple-antenna-port and multiple-radio-port antenna tuning apparatus. Another difference between the invention and the prior art is that any one of the antenna ports of the multiple-antenna-port and multiple-radio-port antenna tuning apparatus is not permanently coupled, directly or through a feeder, to one of the signal ports of the antennas.

The body of the user has an effect on the impedance matrix presented by the antenna array, and this impedance matrix depends on the position of the body of the user. As said above in the prior art section, this is referred to as "user interaction", or "hand effect" or "finger effect", like the effect of the user's body on the impedance presented by a single antenna.

Since the impedance matrix seen by the radio device can approximate an arbitrary wanted matrix, the invention compensates an arbitrary variation in the impedance matrix presented by the antenna array, caused by the user interaction or by a variation in the frequency of operation. Thus, the invention compensates the user interaction.

In this first embodiment, n=m=2. However, it is also possible that n is greater than or equal to 3, it is also possible that n is greater than or equal to 4, it is also possible that m is greater than or equal to 3, and it is also possible that m is greater than or equal to 4. In this first embodiment, N=4. Thus, it is possible that N is greater than or equal to 4.

Second Embodiment

The second embodiment of an apparatus of the invention, given by way of non-limiting example, also corresponds to the portable apparatus for radio communication represented in FIG. 5, and all explanations provided for the first embodiment are applicable to this second embodiment. Additionally, we have represented in FIG. 6 the switching unit (6) used in this second embodiment. This switching unit comprises:

- N=4 input ports (611) (621) (631) (641), each of the input ports being single-ended;
- n=2 output ports (612) (622), each of the output ports being single-ended; and
- n electrically controlled change-over switches (601) each having 1 circuit and N positions (such a switch may be referred to as SP4T in this second embodiment, since N=4).

Figure 6:
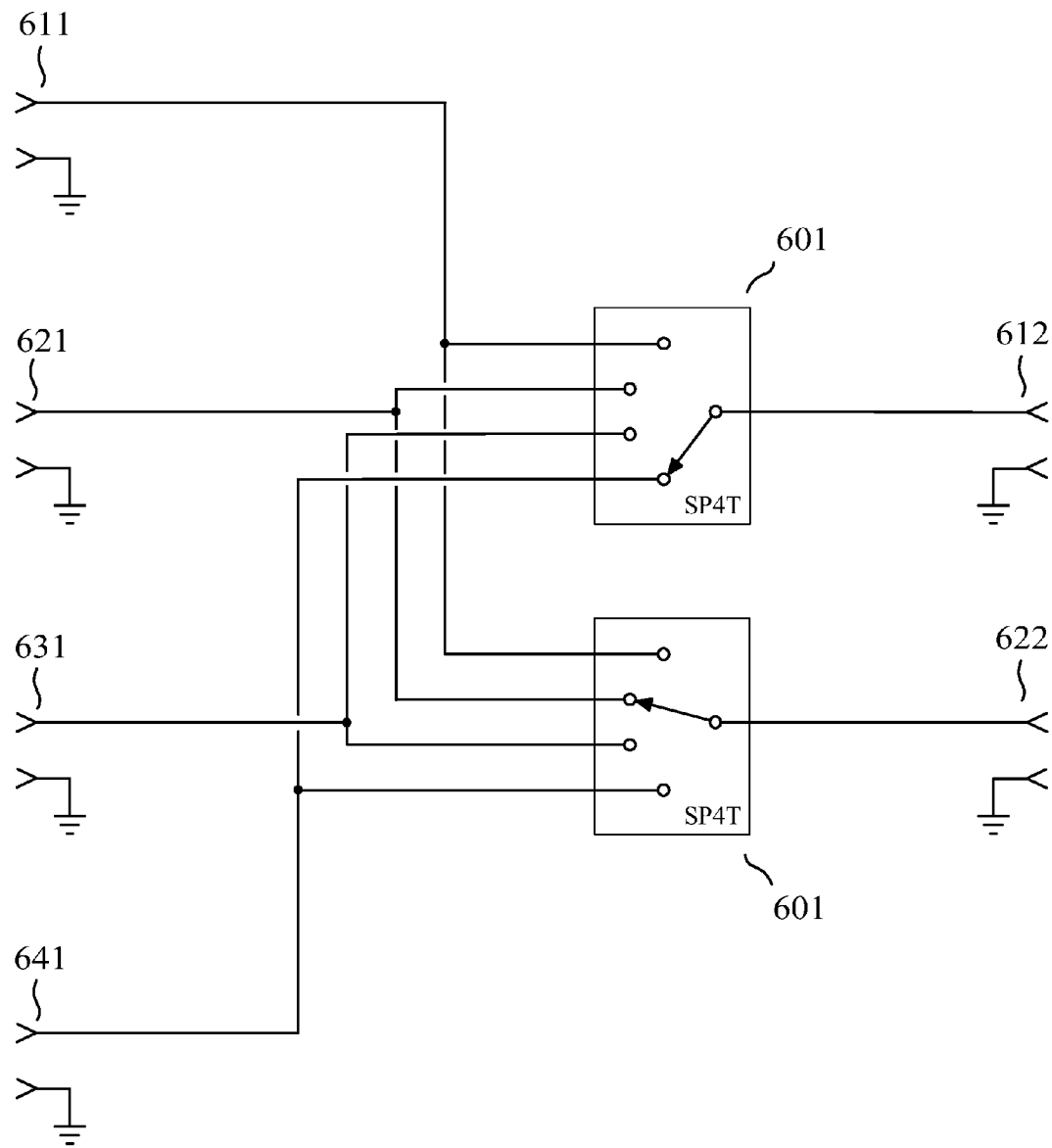
FIG. 6 shows a schematic diagram of a first switching unit which could be used as shown in FIG. 5 to select 2 antennas among 4 antennas.

All change-over switches (601) used in the switching unit of this second embodiment use PIN diodes as switching devices and are electrically controlled, but the control circuits and the control links needed to control the position of each of the change-over switches are not shown in FIG. 6. These control circuits receive the configuration instruction and are such that the switching unit operates in an active configuration determined by the configuration instruction. The active configuration is one of a plurality of allowed configurations.

In the active configuration shown in FIG. 6, the switching unit provides, for signals in the given frequency band, a bidirectional path between a first output port (612) and a first input port (641), and a bidirectional path between a second output port (622) and a second input port (621). Thus, in this active configuration, the n selected input ports are different from one another. More generally, each of the allowed configurations is such that it corresponds to a selection of n input ports among the N input ports, in which the n selected input ports are different from one another. Thus, some combinations of the positions of the electrically controlled change-over switches cannot correspond to an allowed configuration.

The specialist sees that, in this second embodiment, the plurality of allowed configurations may be such that, for any one of the N input ports, there exists at least one allowed configuration in which the switching unit provides, for signals in the given frequency band, a path between one of the output ports and said any one of the N input ports. Equivalently, the plurality of allowed configurations may be such that, for any one of the N input ports, there exists at least one allowed configuration in which said any one of the N input ports is selected (that is to say: there exists at least one allowed configuration such that it corresponds to a selection of n input ports among the N input ports, this selection including said any one of the N input ports). Equivalently, the plurality of allowed configurations may be such that, for any one of the N antennas, there exists at least one allowed configuration in which said any one of the N antennas is selected (that is to say: there exists at least one allowed configuration such that it corresponds to a selection of n antennas among the N antennas, this selection including said any one of the N antennas).

In this second embodiment, the specialist sees that the switching unit is such that, in any one of the allowed configurations, if an input port is such that the switching unit does not provide, for signals in the given frequency band, a path between one of the output ports and said input port, then a single terminal of said input port is left open-circuited. Equivalently, in any one of the allowed configurations, an input port which is not selected has a single terminal which is left open-circuited.

Third Embodiment

The third embodiment of an apparatus of the invention, given by way of non-limiting example, also corresponds to the portable apparatus for radio communication represented in FIG. 5, and all explanations provided for the first embodiment are applicable to this third embodiment. Additionally, we have represented in FIG. 7 the switching unit (6) used in this third embodiment. This switching unit comprises:

- N=4 input ports (611) (621) (631) (641);
- n=2 output ports (612) (622);
- N electrically controlled change-over switches (602) each having 1 circuit and n+1 positions (such a switch may be referred to as SP3T in this third embodiment, since n=2); and
- N passive linear two-terminal devices (603).

Figure 7:
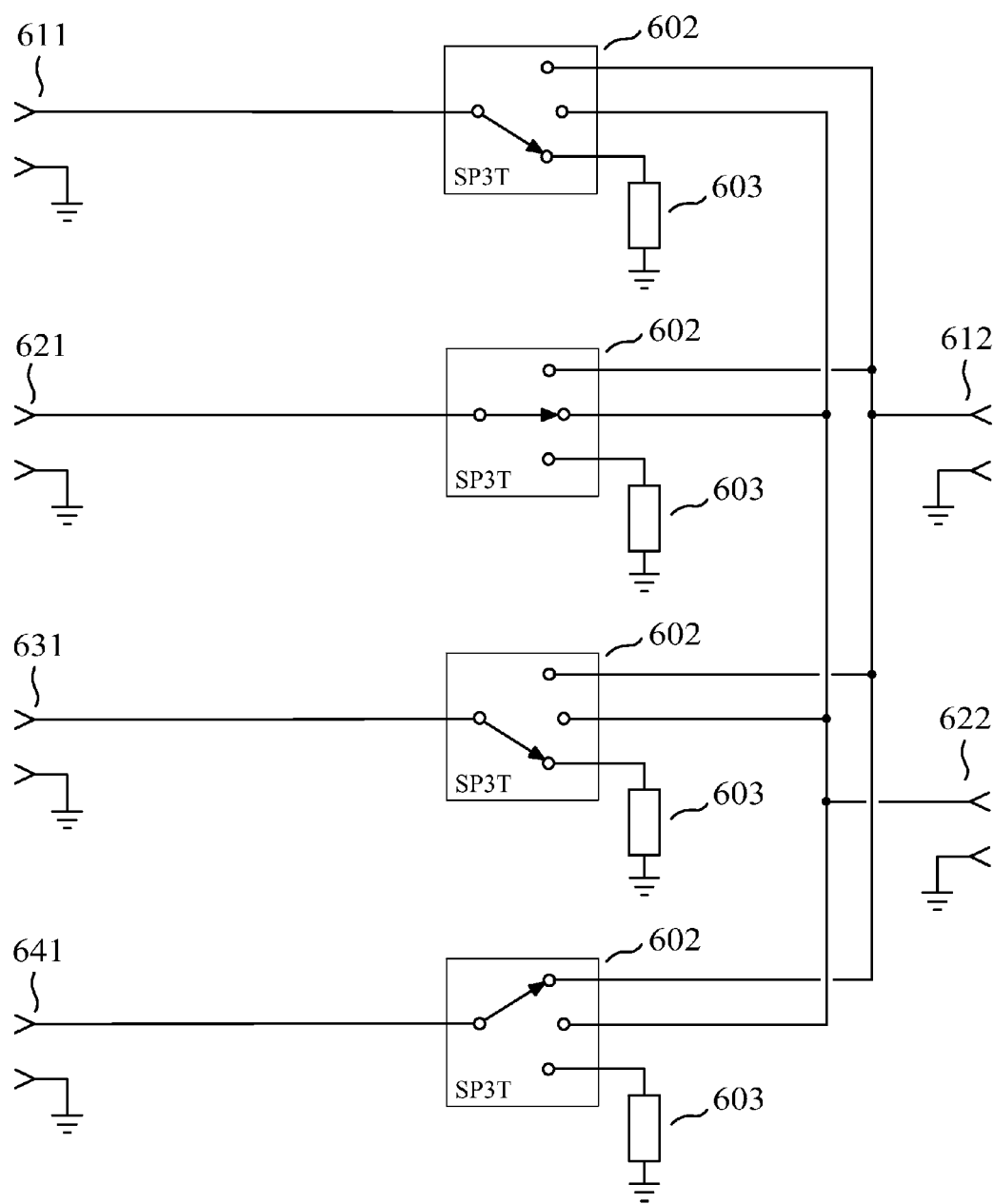
FIG. 7 shows a schematic diagram of a second switching unit which could be used as shown in FIG. 5 to select 2 antennas among 4 antennas.

All change-over switches (602) used in the switching unit of this third embodiment use MOSFETs as switching devices and are electrically controlled, but the control circuits and the control links needed to control the position of each of the change-over switches are not shown in FIG. 7. These control circuits receive the configuration instruction and are such that the switching unit operates in an active configuration determined by the configuration instruction. The active configuration is one of a plurality of allowed configurations.

In the active configuration shown in FIG. 7, the switching unit provides, for signals in the given frequency band, a bidirectional path between a first output port (612) and a first input port (641), and a bidirectional path between a second output port (622) and a second input port (621). Thus, in this active configuration, the n selected input ports are different from one another. More generally, each of the allowed configurations is such that it corresponds to a selection of n input ports among the N input ports, the n selected input ports being different from one another. Thus, some combinations of the positions of the electrically controlled change-over switches cannot correspond to an allowed configuration.

In this third embodiment, the specialist sees that the switching unit is such that, in any one of the allowed configurations, if an input port is such that the switching unit does not provide, for signals in the given frequency band, a path between one of the output ports and said input port, then said input port is coupled to one of the passive linear two-terminal devices. Equivalently, in any one of the allowed configurations, an input port which is not selected is coupled to one of the passive linear two-terminal devices. For instance, any one of the passive linear two-terminal devices may be a capacitor, a resistor, or a short-circuit.

Fourth Embodiment

The fourth embodiment of an apparatus of the invention, given by way of non-limiting example, also corresponds to the portable apparatus for radio communication represented in FIG. 5, and all explanations provided for the first embodiment are applicable to this fourth embodiment. Additionally, we have represented in FIG. 8 the switching unit (6) used in this fourth embodiment. This switching unit comprises:

- N=4 input ports (611) (621) (631) (641);
- n=2 output ports (612) (622);
- N electrically controlled change-over switches (602) each having 1 circuit and n+1 positions (such a switch may be referred to as SP3T in this fourth embodiment, since n=2); and
- N electrically controlled change-over switches (604) each having 1 circuit and 2 positions (such a switch may be referred to as SP2T).

Figure 8:
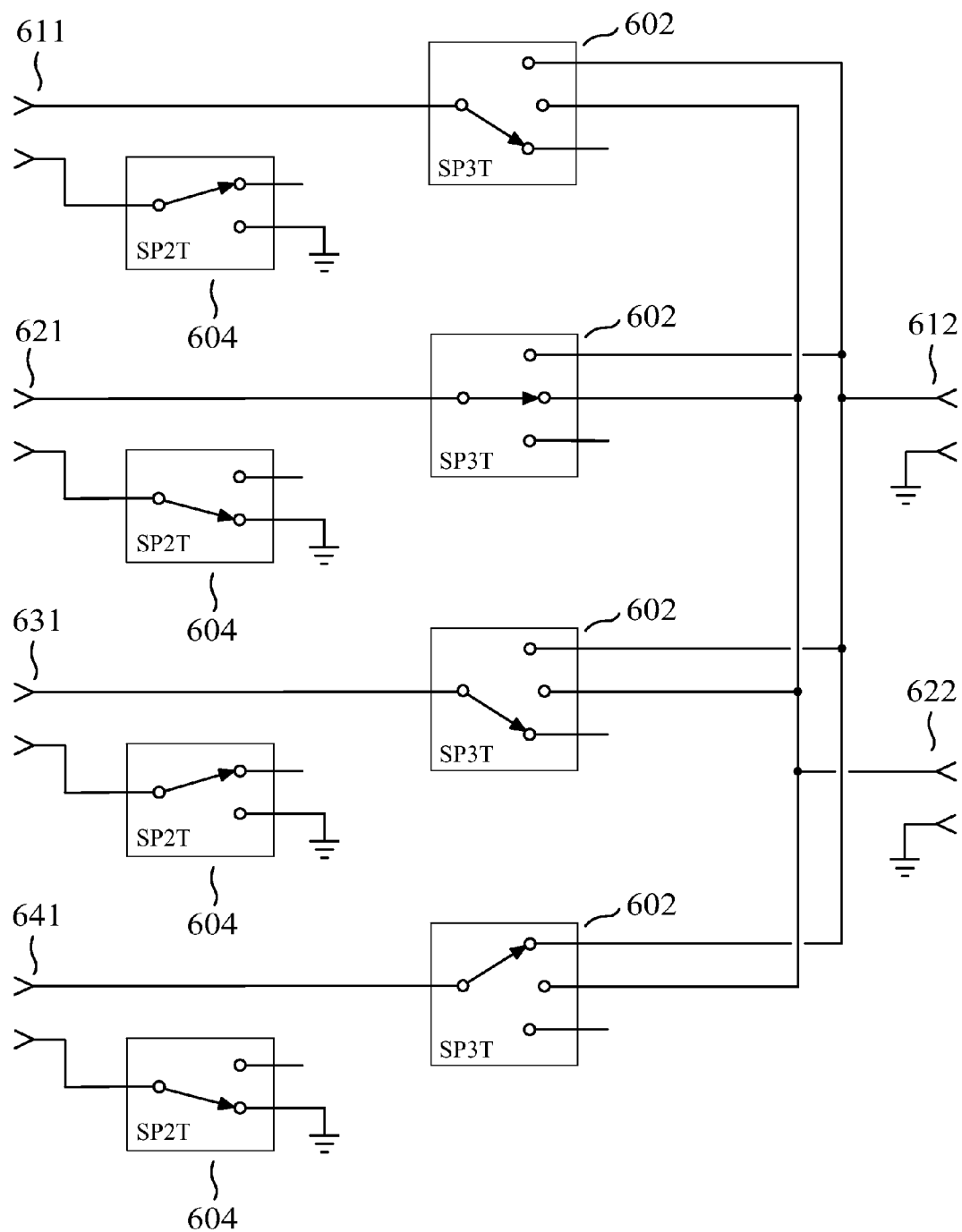
FIG. 8 shows a schematic diagram of a third switching unit which could be used as shown in FIG. 5 to select 2 antennas among 4 antennas.

All change-over switches (602) (604) used in the switching unit of this fourth embodiment use MEMS switches as switching devices and are electrically controlled, but the control circuits and the control links needed to control the position of each of the change-over switches are not shown in FIG. 8. These control circuits receive the configuration instruction and are such that the switching unit operates in an active configuration determined by the configuration instruction. The active configuration is one of a plurality of allowed configurations.

In the active configuration shown in FIG. 8, the switching unit provides, for signals in the given frequency band, a bidirectional path between a first output port (612) and a first input port (641), and a bidirectional path between a second output port (622) and a second input port (621). Thus, in this active configuration, the n selected input ports are different from one another. More generally, each of the allowed configurations is such that it corresponds to a selection of n input ports among the N input ports, in which the n selected input ports are different from one another. Thus, some combinations of the positions of the electrically controlled change-over switches cannot correspond to an allowed configuration.

In this fourth embodiment, the switching unit is such that, in any one of the allowed configurations, if an input port is such that the switching unit does not provide, for signals in the given frequency band, a path between one of the output ports and said input port, then both terminals of said input port are left open-circuited. Equivalently, in any one of the allowed configurations, the terminals of an input port which is not selected are left open-circuited. The article of S. Zhang, K. Zhao, Z. Ying and S. He, entitled "Adaptive Quad-Element Multi-Wideband Antenna Array for User-Effective LTE MIMO Mobile Terminals", published in *IEEE Transactions on Antennas and Propagation*, vol. 61, No. 8, pages 4275-4283, in August 2013, indicates that this characteristic may be advantageous. However, the device described in this article is entirely different from the present invention because it does not comprise a multiple-antenna-port and multiple-radio-port antenna tuning apparatus, and it cannot compensate an arbitrary variation in the impedance matrix presented by the antenna array, caused by the user interaction or by a variation in the frequency of operation. Thus, the device described in this article does not compensate the user interaction.

Fifth Embodiment

The fifth embodiment of an apparatus of the invention, given by way of non-limiting example, also corresponds to the portable apparatus for radio communication represented in FIG. 5, and all explanations provided for the first embodiment are applicable to this fifth embodiment.

In this fifth embodiment, the antenna tuning apparatus (3) is an antenna tuning apparatus disclosed in said French patent application number 12/02542 and said international application PCT/IB2013/058423. Thus, the antenna tuning apparatus (3) is such that the reactance of any one of the adjustable impedance devices of the antenna tuning apparatus has, at said frequency in said given frequency band, if the impedance matrix seen by the antenna ports is equal to a given diagonal impedance matrix, an influence on the impedance matrix presented by the radio ports, and such that the reactance of at least one of the adjustable impedance devices of the antenna tuning apparatus has, at said frequency in said given frequency band, if the impedance matrix seen by the antenna ports is equal to the given diagonal impedance matrix, an influence on at least one non-diagonal entry of the impedance matrix presented by the radio ports. This must be interpreted as meaning: the antenna tuning apparatus is such that, at said frequency in said given frequency band, there exists a diagonal impedance matrix referred to as the given diagonal impedance matrix, the given diagonal impedance matrix being such that, if an impedance matrix seen by the antenna ports is equal to the given diagonal impedance matrix, then (a) the reactance of any one of the adjustable impedance devices of the antenna tuning apparatus has an influence on an impedance matrix presented by the radio ports, and (b) the reactance of at least one of the adjustable impedance devices of the antenna tuning apparatus has an influence on at least one non-diagonal entry of the impedance matrix presented by the radio ports. In the two previous sentences, "an influence" could be replaced with "an effect".

The specialist understands that the antenna tuning apparatus (3) cannot be made up of a plurality of independent and uncoupled antenna tuning apparatuses each having a single antenna port and a single radio port, because in this case, if the impedance matrix seen by the antenna ports is equal to any diagonal impedance matrix, then the impedance matrix presented by the radio ports is a diagonal matrix, the non-diagonal entries of which cannot be influenced by anything.

Moreover, the antenna tuning apparatus (3) is such that, at said frequency in said given frequency band, if the impedance matrix seen by the antenna ports is equal to a given non-diagonal impedance matrix, a mapping associating the impedance matrix presented by the radio ports to the p reactances is defined, the mapping having, at a given value of each of the p reactances, a partial derivative with respect to each of the p reactances, a span of the p partial derivatives being defined in the set of the complex matrices of size m×m considered as a real vector space, any diagonal complex matrix of size m×m having the same diagonal entries as at least one element of the span of the p partial derivatives. This must be interpreted as meaning: the antenna tuning apparatus is such that, at said frequency in said given frequency band, there exists a non-diagonal impedance matrix referred to as the given non-diagonal impedance matrix, the given non-diagonal impedance matrix being such that, if an impedance matrix seen by the antenna ports is equal to the given non-diagonal impedance matrix, then a mapping associating an impedance matrix presented by the radio ports to the p reactances is defined, the mapping having, at a given value of each of the p reactances, a partial derivative with respect to each of the p reactances, a span of the p partial derivatives being defined in the set of the complex matrices of size m×m considered as a real vector space, any diagonal complex matrix of size m×m having the same diagonal entries as at least one element of the span of the p partial derivatives.

The specialist knows that the dimension of the span of the p partial derivatives considered as a real vector space has been used and explained: in said French patent application number 12/02542; in said international application PCT/IB2013/058423; and in the sections I, III, VI, VII and VIII of the article of F. Broydé and E. Clavelier entitled "Some Properties of Multiple-Antenna-Port and Multiple-User-Port Antenna Tuners", published in *IEEE Trans. on Circuits and Systems—I: Regular Papers*, Vol. 62, No. 2, pp. 423-432, in February 2015, where said dimension of the span of the p partial derivatives is referred to as the local dimension of the user port impedance range, and denoted by $D_{UR}(Z_{Sant})$.

Thus, the specialist understands that any small variation in the impedance matrix of the antenna array, caused by a change in operating frequency or a change in the medium surrounding the antennas, can be at least partially compensated with a new adjustment of the adjustable impedance devices of the antenna tuning apparatus.

More generally, a specialist understands that, to obtain that any diagonal complex matrix of size m×m has the same diagonal entries as at least one element of the span of the p partial derivatives, it is necessary that the dimension of the span of the p partial derivatives considered as a real vector space is greater than or equal to the dimension of the subspace of the diagonal complex matrices of size m×m considered as a real vector space. Since the dimension of the span of the p partial derivatives considered as a real vector space is less than or equal to p, and since the dimension of the subspace of the diagonal complex matrices of size m×m considered as a real vector space is equal to 2m, the necessary condition implies that p is an integer greater than or equal to 2m. This is why the requirement "p is an integer greater than or equal to 2m" is an essential characteristic of the invention.

Sixth Embodiment

Figure 9:
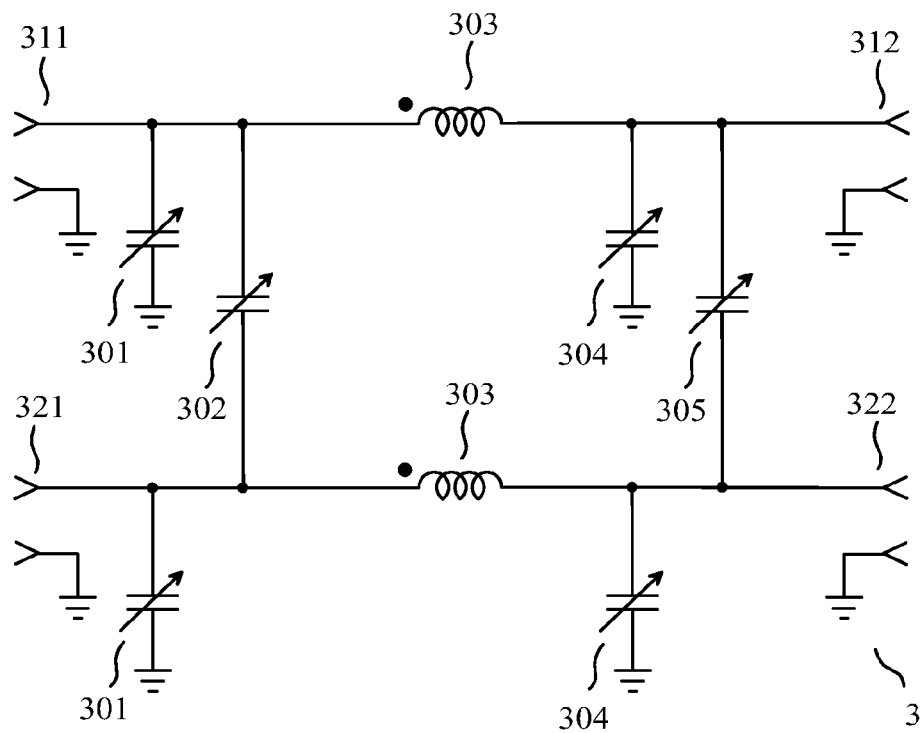
FIG. 9 shows a schematic diagram of a first antenna tuning apparatus which could be used as shown in FIG. 5 to simultaneously tune 2 selected antennas.

The sixth embodiment of an apparatus of the invention, given by way of non-limiting example, also corresponds to the portable apparatus for radio communication represented in FIG. 5, and all explanations provided for the first embodiment and the fifth embodiment are applicable to this sixth embodiment. The antenna tuning apparatus (3) used in this sixth embodiment is shown in FIG. 9 and it comprises:

n=2 antenna ports (311) (321), each of the antenna ports being single-ended;

m=2 radio ports (312) (322), each of the radio ports being single-ended;

n adjustable impedance devices of the antenna tuning apparatus (301) each presenting a negative reactance and each being coupled in parallel with one of the antenna ports;

n (n−1)/2 adjustable impedance devices of the antenna tuning apparatus (302) each presenting a negative reactance and each having a first terminal coupled to one of the antenna ports and a second terminal coupled to one of the antenna ports which is different from the antenna port to which the first terminal is coupled;

n=m windings (303) each having a first terminal coupled to one of the antenna ports and a second terminal coupled to one of the radio ports;

m adjustable impedance devices of the antenna tuning apparatus (304) each presenting a negative reactance and each being coupled in parallel with one of the radio ports;

m (m−1)/2 adjustable impedance devices of the antenna tuning apparatus (305) each presenting a negative reactance and each having a first terminal coupled to one of the radio ports and a second terminal coupled to one of the radio ports which is different from the radio port to which the first terminal is coupled.

It is possible that mutual induction exists between the windings (303). In this case, the inductance matrix of the windings is not a diagonal matrix.

All adjustable impedance devices of the antenna tuning apparatus (301) (302) (304) (305) are adjustable by electrical means, but the circuits and the control links needed to determine the reactance of each of the adjustable impedance devices of the antenna tuning apparatus are not shown in FIG. 9. In this sixth embodiment, we have n=m and we use p=m (m+1)=6 adjustable impedance devices of the antenna tuning apparatus.

The specialist understands that, at a frequency at which the antenna tuning apparatus is intended to operate, if the impedance matrix seen by the antenna ports is a diagonal matrix having all its diagonal entries equal to 50Ω, the reactance of any one of the adjustable impedance devices of the antenna tuning apparatus has an influence on the impedance matrix presented by the radio ports, and the reactance of one or more of the adjustable impedance devices of the antenna tuning apparatus has an influence on one or more of the non-diagonal entries of the impedance matrix presented by the radio ports.

The impedance matrix seen by the antenna ports being a given symmetric complex matrix, it is possible to show that, for suitable component values, the p partial derivatives defined above in the section on the fifth embodiment are linearly independent in the real vector space of the complex matrices of size m×m, this vector space, denoted by E, being of dimension $2m^2$. Thus, the span of the p partial derivatives in E is a subspace of dimension p equal to the set of the symmetric complex matrices of size m×m. Here, any symmetric complex matrix of size m×m is an element of the span of the p partial derivatives. Consequently, any diagonal complex matrix of size m×m has the same diagonal entries as at least one element of the span of the p partial derivatives.

The reactance of an adjustable impedance device of the antenna tuning apparatus may depend on the ambient temperature, for some types of adjustable impedance devices. If such a type of adjustable impedance device is used in the antenna tuning apparatus, it is possible that the tuning control signals are determined as a function of the tuning instruction and as a function of temperature, to compensate the effect of temperature on the reactance of each of the adjustable impedance devices of the antenna tuning apparatus. At least one of the tuning control signals is determined as a function of the tuning instruction and as a function of temperature, to compensate the effect of temperature on the reactance of at least one of the adjustable impedance devices of the antenna tuning apparatus.

The specialist understands that, as explained in said article entitled "Some Properties of Multiple-Antenna-Port and Multiple-User-Port Antenna Tuners" and in the article of F. Broydé and E. Clavelier entitled "A New Multiple-Antenna-Port and Multiple-User-Port Antenna Tuner", published in the proceedings of the 2015 *IEEE Radio & Wireless Week, RWW* 2015, in January 2015, any small variation in the impedance matrix of the antenna array, caused by a change in operating frequency or a change in the medium surrounding the antennas, can be fully compensated with a new adjustment of the adjustable impedance devices of the antenna tuning apparatus. Thus, it is always possible to compensate the user interaction.

Figure 1:
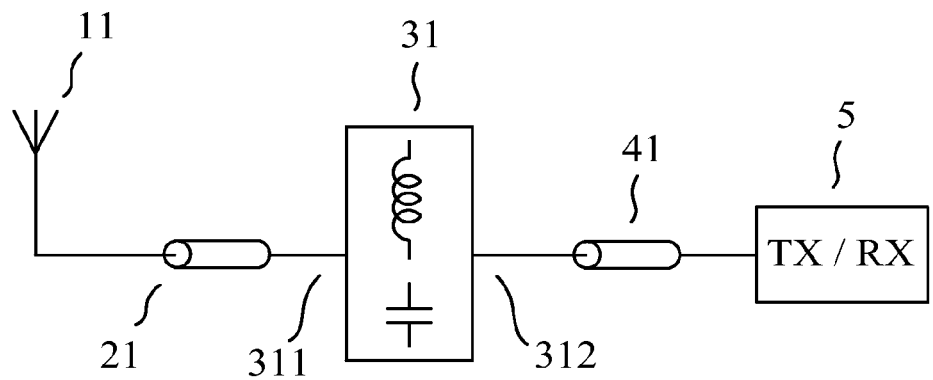
FIG. 1 shows a block diagram of a typical use of an antenna tuning apparatus for tuning a single antenna, and has already been discussed in the section dedicated to the presentation of the prior art.
Figure 2:
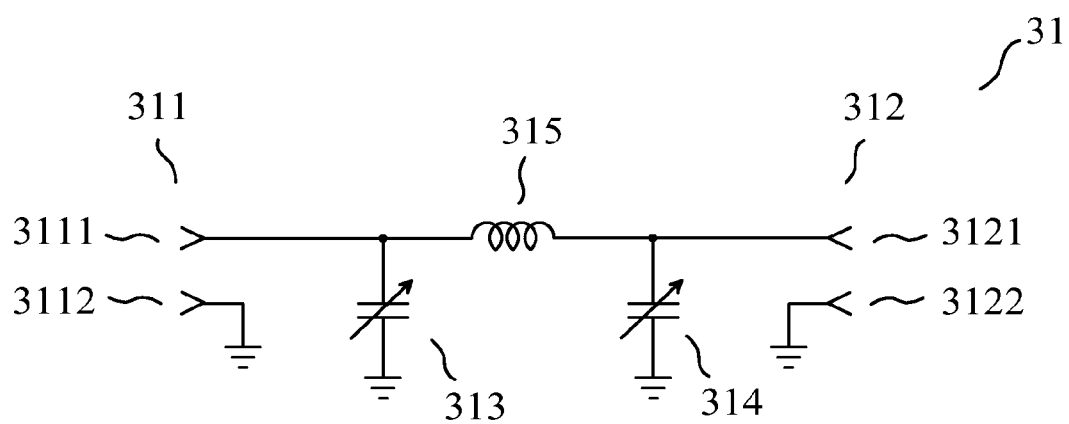
FIG. 2 shows a schematic diagram of an antenna tuning apparatus which could be used as shown in FIG. 1 to tune a single antenna, and has already been discussed in the section dedicated to the presentation of the prior art.
Figure 3:
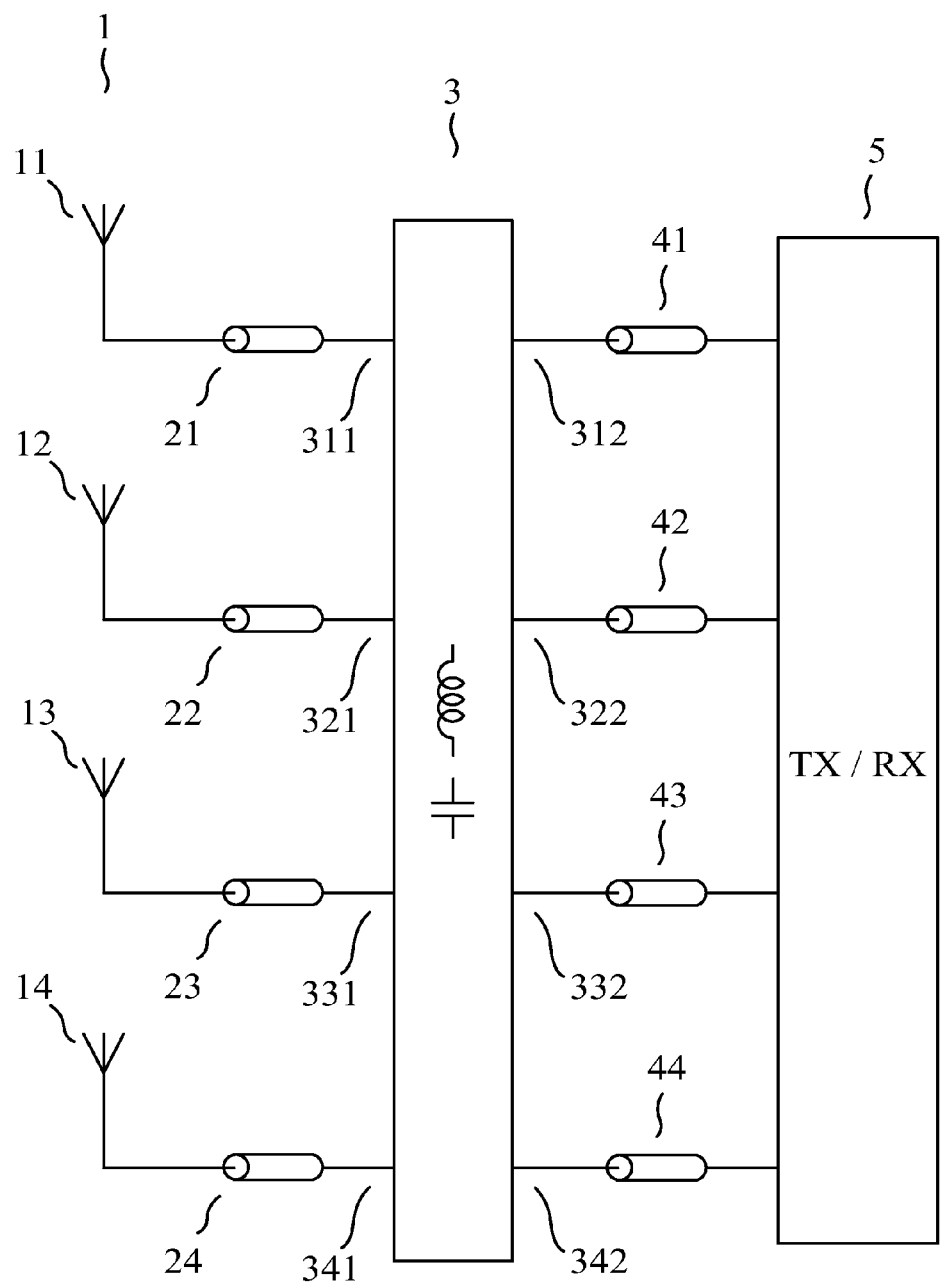
FIG. 3 shows a block diagram of a typical use of an antenna tuning apparatus for simultaneously tuning 4 antennas, and has already been discussed in the section dedicated to the presentation of the prior art.
Figure 4:
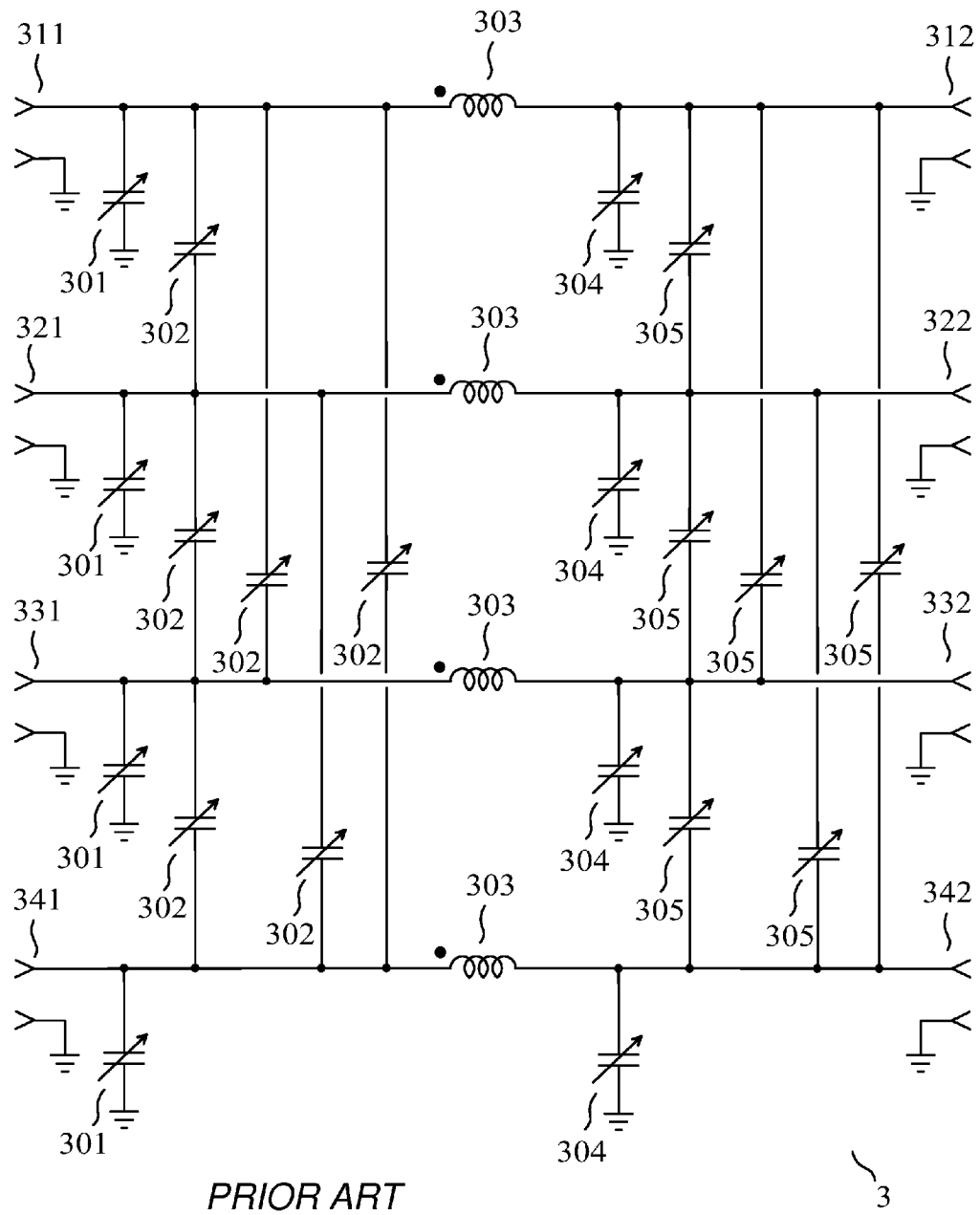
FIG. 4 shows a schematic diagram of an antenna tuning apparatus which could be used as shown in FIG. 3 to simultaneously tune 4 antennas, and has already been discussed in the section dedicated to the presentation of the prior art.

Moreover, said important limitation of the state of the art relating to automatic antenna tuning is overcome by the invention because, for N=4 antennas, this sixth embodiment uses only 6 adjustable impedance devices of the antenna tuning apparatus, instead of the 20 adjustable impedance devices of the antenna tuning apparatus used in FIG. 4.

Seventh Embodiment

Figure 10:
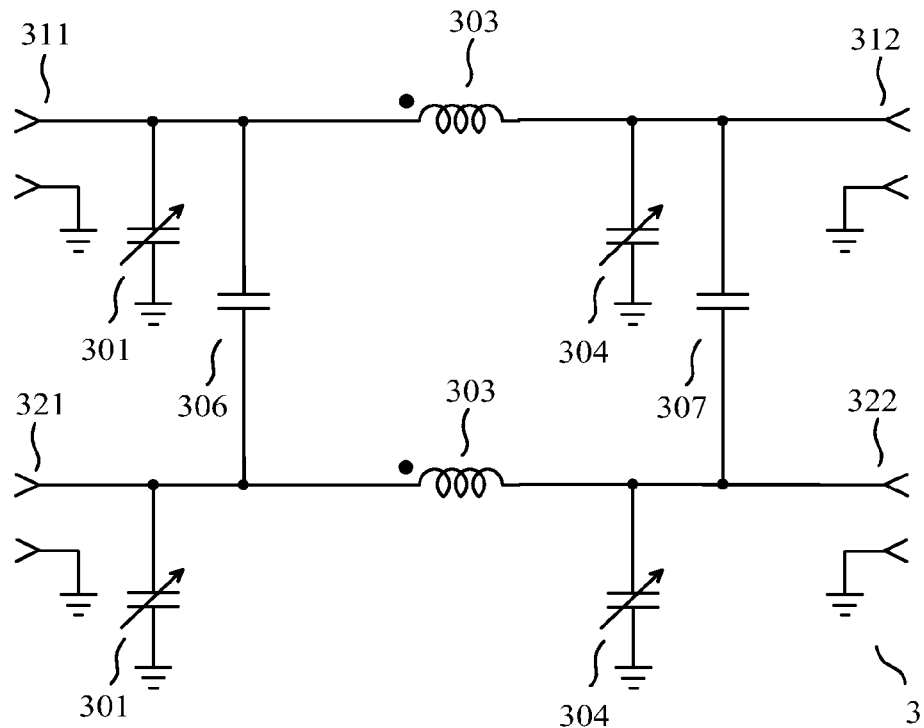
FIG. 10 shows a schematic diagram of a second antenna tuning apparatus which could be used as shown in FIG. 5 to simultaneously tune 2 selected antennas.

The seventh embodiment of an apparatus of the invention, given by way of non-limiting example, also corresponds to the portable apparatus for radio communication represented in FIG. 5, and all explanations provided for the first embodiment and the fifth embodiment are applicable to this seventh embodiment. Additionally, the antenna tuning apparatus (3) used in this seventh embodiment is shown in FIG. 10 and it comprises:

n=2 antenna ports (311) (321), each of the antenna ports being single-ended;

m=2 radio ports (312) (322), each of the radio ports being single-ended;

n adjustable impedance devices of the antenna tuning apparatus (301) each presenting a negative reactance and each being coupled in parallel with one of the antenna ports;

n (n−1)/2 capacitors (306) each having a first terminal coupled to one of the antenna ports and a second terminal coupled to one of the antenna ports which is different from the antenna port to which the first terminal is coupled;

n=m windings (303) each having a first terminal coupled to one of the antenna ports and a second terminal coupled to one of the radio ports;

m adjustable impedance devices of the antenna tuning apparatus (304) each presenting a negative reactance and each being coupled in parallel with one of the radio ports;

m (m−1)/2 capacitors (307) each having a first terminal coupled to one of the radio ports and a second terminal coupled to one of the radio ports which is different from the radio port to which the first terminal is coupled.

It is possible that mutual induction exists between the windings (303). In this case, the inductance matrix of the windings is not a diagonal matrix.

All adjustable impedance devices of the antenna tuning apparatus (301) (304) are adjustable by electrical means, but the circuits and the control links needed to determine the reactance of each of the adjustable impedance devices of the antenna tuning apparatus are not shown in FIG. 10.

The specialist understands that, at a frequency at which the antenna tuning apparatus is intended to operate, if the impedance matrix seen by the antenna ports is a diagonal matrix having all its diagonal entries equal to 50Ω, the reactance of any one of the adjustable impedance devices of the antenna tuning apparatus has an influence on the impedance matrix presented by the radio ports, and the reactance of one or more of the adjustable impedance devices of the antenna tuning apparatus has an influence on one or more of the non-diagonal entries of the impedance matrix presented by the radio ports.

For suitable component values, it is possible to show that the p=4 partial derivatives are linearly independent in the real vector space of the complex matrices of size m×m, denoted by E. Thus, the span of the p partial derivatives in E is of dimension 4. It is also possible to show that any diagonal complex matrix of size m×m has the same diagonal entries as at least one element of the span of the p partial derivatives.

The specialist understands that any small variation in the impedance matrix of the antenna array, caused by a change in operating frequency or a change in the medium surrounding the antennas, can be partially compensated with a new adjustment of the adjustable impedance devices of the antenna tuning apparatus.

Moreover, said important limitation of the state of the art relating to automatic antenna tuning is overcome by the invention because, for N=4 antennas, this seventh embodiment uses only 4 adjustable impedance devices of the antenna tuning apparatus, instead of the 20 adjustable impedance devices of the antenna tuning apparatus used in FIG. 4.

If the capacitors (306) (307) shown in FIG. 10 were not present in FIG. 10, and if mutual induction did not exist between the windings (303), then the antenna tuning apparatus (3) comprising n=2 antenna ports and m=2 radio ports would in fact be made up of n=2 antenna tuning apparatuses each having a single antenna port and a single radio port, these antenna tuning apparatuses each having a single antenna port and a single radio port being independent and uncoupled. In this case, the method of the invention may become a method for radio communication with several antennas in a given frequency band, using an apparatus for radio communication that includes N antennas, where N is an integer greater than or equal to 3, each of the N antennas being such that it can operate at any frequency in the given frequency band, the method comprising the steps of:

selecting n antennas among the N antennas, where n is an integer greater than or equal to 2 and less than or equal to N minus 1, using a switching unit comprising N input ports and n output ports, each of the N input ports being coupled, directly or indirectly, to one of the N antennas, the switching unit providing, for any small signal in the given frequency band and for any one of the output ports, a path between said any one of the output ports and one of the input ports, said one of the input ports being coupled to one of the n selected antennas, the n selected antennas being determined by a "configuration instruction";

coupling the n output ports, directly or indirectly, to n antenna ports of n antenna tuning apparatuses, each of said antenna tuning apparatuses comprising, in addition to one of said n antenna ports, one radio port, and two or more adjustable impedance devices such that, at a frequency in said given frequency band, each of the adjustable impedance devices of said each of said antenna tuning apparatuses has a reactance, the reactance of any one of the adjustable impedance devices being adjustable by electrical means; and generating a "tuning instruction", the tuning instruction having an effect on the reactance of each of the adjustable impedance devices of the antenna tuning apparatuses.

In this method, each of the output ports may be coupled, directly or indirectly, to one and only one of the antenna ports of the n antenna tuning apparatuses.

An apparatus implementing this method is an apparatus for radio communication using several antennas in a given frequency band, the apparatus for radio communication comprising:

N antennas, where N is an integer greater than or equal to 3, each of the N antennas being such that it can operate at any frequency in the given frequency band;

a processing unit, the processing unit delivering a "configuration instruction" and a "tuning instruction";

a switching unit comprising N input ports and n output ports, where n is an integer greater than or equal to 2 and less than or equal to N minus 1, each of the N input ports being coupled, directly or indirectly, to one of the N antennas, the switching unit operating in an active configuration determined by the configuration instruction, the active configuration being one of a plurality of allowed configurations, the switching unit providing, in any one of the allowed configurations, for any small signal in the given frequency band and for any one of the output ports, a path between said any one of the output ports and one of the input ports;

n antenna tuning apparatuses, each of said antenna tuning apparatuses comprising one antenna port, one radio port, and two or more adjustable impedance devices such that, at a frequency in said given frequency band, each of the adjustable impedance devices of said each of said antenna tuning apparatuses has a reactance, the reactance of any one of the adjustable impedance devices being adjustable by electrical means, the n output ports being coupled, directly or indirectly, to the n antenna ports; and a tuning control unit, the tuning control unit receiving the tuning instruction, the tuning control unit delivering a plurality of "tuning control signals", the tuning control signals being determined as a function of the tuning instruction, the reactance of each of the adjustable impedance devices of the antenna tuning apparatuses being mainly determined by one or more of the tuning control signals.

Eighth Embodiment

The eighth embodiment of a device of the invention, given by way of non-limiting example, is an apparatus for radio communication comprising a radio receiver implementing a method for radio reception with several antennas in a given frequency band, the apparatus for radio communication including N antennas, where N is an integer greater than or equal to 3, each of the N antennas being such that it can operate at any frequency in the given frequency band, the method comprising the steps of:

selecting n antennas among the N antennas, where n is an integer greater than or equal to 2 and less than or equal to N minus 1, using a switching unit comprising N input ports and n output ports, each of the N input ports being coupled, directly or indirectly, to one of the N antennas, the switching unit providing, for any small signal in the given frequency band and for any one of the n output ports, a path between said any one of the n output ports and one of the input ports, said one of the input ports being coupled to one of the n selected antennas;

coupling the n output ports, directly or indirectly, to n antenna ports of an antenna tuning apparatus comprising, in addition to said n antenna ports, m radio ports and p adjustable impedance devices, where m is an integer greater than or equal to 2 and where p is an integer greater than or equal to 2m, the p adjustable impedance devices being referred to as "the adjustable impedance devices of the antenna tuning apparatus" and being such that, at a frequency in said given frequency band, each of the adjustable impedance devices of the antenna tuning apparatus has a reactance, the reactance of any one of the adjustable impedance devices of the antenna tuning apparatus being adjustable by electrical means;

processing a plurality of digital signals to estimate one or more quantities representative of a channel matrix;

delivering a "configuration instruction", the n selected antennas being determined by the configuration instruction; and delivering a "tuning instruction", the tuning instruction being a function of said one or more quantities representative of a channel matrix, the tuning instruction having an effect on the reactance of each of the adjustable impedance devices of the antenna tuning apparatus.

The configuration instruction may also be a function of said one or more quantities representative of a channel matrix.

For instance, as in said French patent application number 12/02564 and said international application number PCT/IB2013/058574, the method may be such that, each of the radio ports delivering a signal, each of the digital signals is mainly determined by one and only one of the signals delivered by the radio ports, and such that the channel matrix is a channel matrix between a plurality of signals sent by a transmitter and the m signals delivered by the radio ports. For instance, one or more quantities representative of a channel capacity may be computed as a function of said quantities representative of a channel matrix, the configuration instruction and the tuning instruction being delivered as a function of said one or more quantities representative of a channel capacity. The specialist understands that, in order to compute said one or more quantities representative of a channel capacity, at least one quantity representative of a signal to noise ratio of reception may be estimated.

The method may be such that an adaptive process is implemented during one or more training sequences. A training sequence may comprise the emission of a plurality of quasi-orthogonal or orthogonal signals. The configuration instruction and the tuning instruction selected during the latest completed training sequence may be used for radio reception.

The adaptive process may be such that, most of the time, the tuning instruction used for reception is a tuning instruction which, for a chosen configuration instruction, among a finite set of possible tuning instructions, produces values of said one or more quantities representative of a channel capacity which correspond to one of the largest channel capacities (or preferably, to the largest channel capacity).

Ninth Embodiment

The ninth embodiment of a device of the invention, given by way of non-limiting example, is an apparatus for radio communication comprising a radio transmitter implementing a method for radio emission with several antennas in a given frequency band, the apparatus for radio communication including N antennas, where N is an integer greater than or equal to 3, each of the N antennas being such that it can operate at any frequency in the given frequency band, the method comprising the steps of:

selecting n antennas among the N antennas, where n is an integer greater than or equal to 2 and less than or equal to N minus 1, using a switching unit comprising N input ports and n output ports, each of the N input ports being coupled, directly or indirectly, to one of the N antennas, the switching unit providing, for any small signal in the given frequency band and for any one of the n output ports, a path between said any one of the n output ports and one of the input ports, said one of the input ports being coupled to one of the n selected antennas;

coupling the n output ports, directly or indirectly, to n antenna ports of an antenna tuning apparatus comprising, in addition to said n antenna ports, m radio ports and p adjustable impedance devices, where m is an integer greater than or equal to 2 and where p is an integer greater than or equal to 2m, the p adjustable impedance devices being referred to as "the adjustable impedance devices of the antenna tuning apparatus" and being such that, at a frequency in said given frequency band, each of the adjustable impedance devices of the antenna tuning apparatus has a reactance, the reactance of any one of the adjustable impedance devices of the antenna tuning apparatus being adjustable by electrical means;

estimating q real quantities depending on an impedance matrix presented by the radio ports, where q is an integer greater than or equal to m, using m or more different excitations applied successively to the radio ports;

delivering a "configuration instruction", the n selected antennas being determined by the configuration instruction; and delivering a "tuning instruction", the tuning instruction being a function of said q real quantities depending on an impedance matrix presented by the radio ports, the tuning instruction having an effect on the reactance of each of the adjustable impedance devices of the antenna tuning apparatus.

The configuration instruction may also be a function of said q real quantities depending on an impedance matrix presented by the radio ports.

The specialist understands that this ninth embodiment uses some aspects of the technique disclosed in said French patent application number 13/00878 and said international application number PCT/IB2014/058933.

Tenth Embodiment

Figure 11:
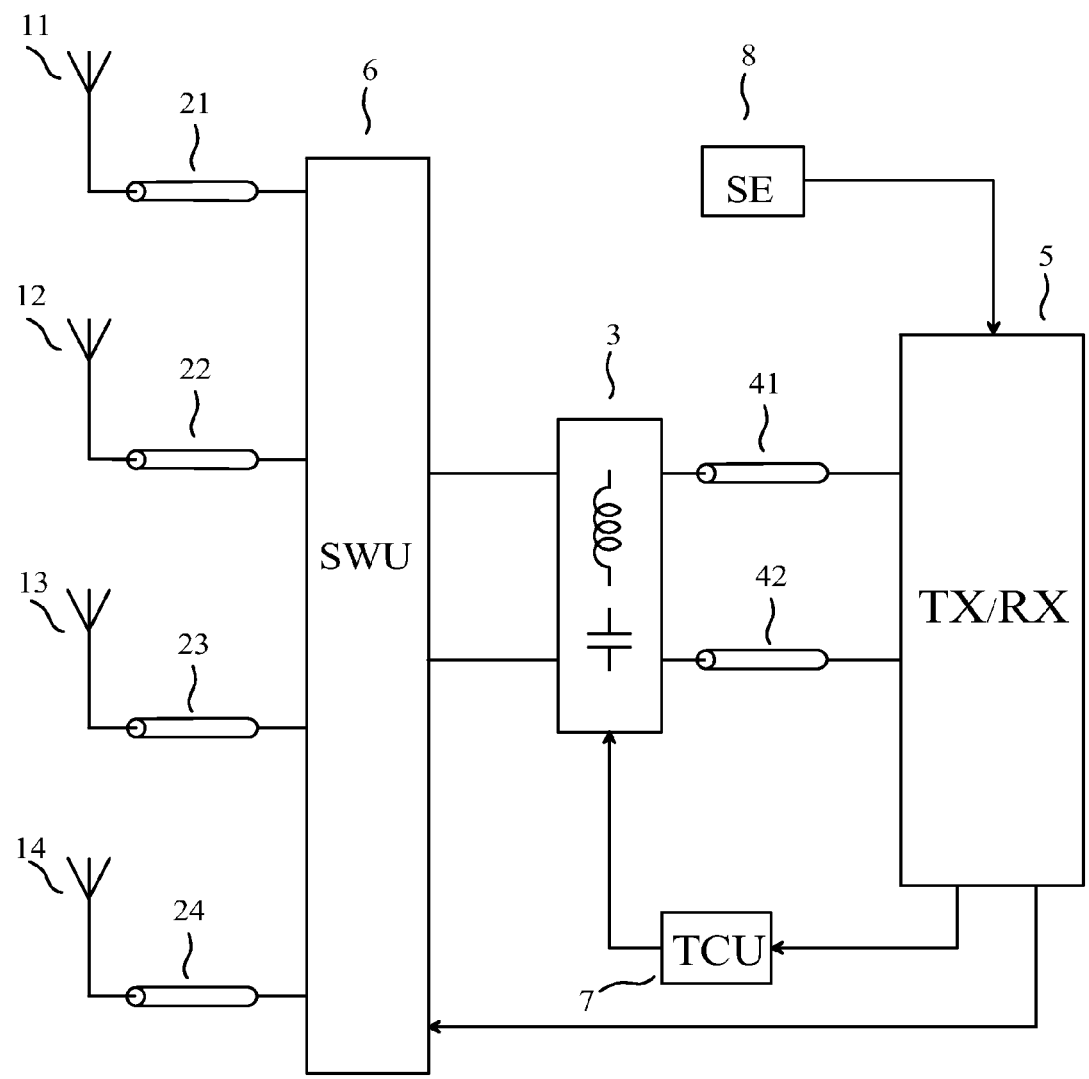
FIG. 11 shows a block diagram of a transceiver for radio communication of the invention, which simultaneously uses 2 selected antennas among 4 antennas.

As a tenth embodiment of an apparatus of the invention, given by way of non-limiting example, we have represented in FIG. 11 the block diagram of a portable apparatus for radio communication in a given frequency band, the apparatus for radio communication being a transceiver comprising:

N=4 antennas (11) (12) (13) (14), each of the N antennas being such that it can operate at any frequency in the given frequency band;

a radio device (5) which consists of all parts of the apparatus for radio communication which are not shown elsewhere in FIG. 11;

a switching unit (6), the switching unit receiving a "configuration instruction" generated automatically within the apparatus for radio communication, the switching unit comprising N input ports each coupled to one and only one of the antennas through a feeder (21) (22) (23) (24), the switching unit comprising n=2 output ports, the switching unit operating in an active configuration determined by the configuration instruction, the active configuration being one of a plurality of allowed configurations, any one of the allowed configurations corresponding to a selection of n input ports among the N input ports, the switching unit providing, for any small signal in the given frequency band and for any one of the output ports, a bidirectional path between said any one of the output ports and one and only one input port of said selection of n input ports;

a sensor unit (8) estimating a plurality of localization variables;

an antenna tuning apparatus (3), the antenna tuning apparatus being a multiple-antenna-port and multiple-radio-port antenna tuning apparatus, the antenna tuning apparatus comprising n=2 antenna ports, each of the output ports being coupled to one and only one of the antenna ports, the antenna tuning apparatus comprising m=2 radio ports, each of the radio ports being coupled to the radio device (5) through an interconnection (41) (42), the antenna tuning apparatus comprising p adjustable impedance devices, where p is an integer greater than or equal to 2m, the p adjustable impedance devices being referred to as "the adjustable impedance devices of the antenna tuning apparatus" and being such that, at a frequency in said given frequency band, each of the adjustable impedance devices of the antenna tuning apparatus has a reactance, the reactance of any one of the adjustable impedance devices of the antenna tuning apparatus being adjustable by electrical means; and a tuning control unit (7), the tuning control unit receiving a "tuning instruction" generated automatically within the apparatus for radio communication, the tuning control unit delivering a plurality of "tuning control signals" to the antenna tuning apparatus (3), the tuning control signals being determined as a function of the tuning instruction, the reactance of each of the adjustable impedance devices of the antenna tuning apparatus being mainly determined by one or more of the tuning control signals.

The sensor unit (8) estimates a plurality of localization variables each depending, in a given use configuration, on the distance between a part of a human body and a zone of the apparatus for radio communication. The sensor unit comprises a plurality of sensors. Each of said zones may be a part of the space occupied by the corresponding sensor, this space being inside the space occupied by the apparatus for radio communication, so that in this case each of said zones has a volume much less than the volume of the apparatus for radio communication. For each of the antennas, at least one of the localization variables may depend on the distance between a part of a human body and a small zone near said each of the antennas. If a suitable sensor is used, said zone may be a point, or substantially a point.

For instance, at least one of the localization variables may be an output of a sensor responsive to a pressure exerted by a part of a human body. For instance, at least one of the localization variables may be an output of a proximity sensor.

The sensor unit (8) assesses (or equivalently, estimates) a plurality of localization variables each depending, in a given use configuration, on the distance between a part of a human body and a zone of the apparatus for radio communication. However, it is possible that one or more other localization variables each depending, in a given use configuration, on the distance between a part of a human body and a zone of the apparatus for radio communication, are not estimated by the sensor unit. For instance, at least one of the localization variables may be determined by a change of state of an output of a touchscreen. Thus, the sensor unit (8) may be regarded as a part of a localization unit which estimates (or evaluates) a plurality of variables, each of said variables being referred to as "localization variable", each of the localization variables depending on the distance between a part of a human body and a zone of the apparatus for radio communication. This part of the localization unit may be the whole localization unit.

The configuration instruction and the tuning instruction are generated automatically within the radio device (5). More precisely, the radio device (5) comprises a processing unit (not shown in FIG. 11) which delivers the configuration instruction and the tuning instruction, each of the localization variables having an influence on the configuration instruction and/or on the tuning instruction. The configuration instruction is determined from a set of pre-defined configuration instructions stored in a lookup table (also spelled "look-up table") realized in the processing unit, based on the localization variables and on the frequencies used for radio communication with the antennas.

The tuning instruction may be determined from a set of pre-defined tuning instructions stored in a lookup table realized in the processing unit, based on the localization variables and on the frequencies used for radio communication with the antennas.

This tenth embodiment may possibly use some aspects of the technique disclosed in the French patent application number 14/00606 entitled "Communication radio utilisant des antennes multiples et des variables de localisation", corresponding to the international application number PCT/IB2015/051548 of 3 Mar. 2015 entitled "Radio communication using multiple antennas and localization variables".

Eleventh Embodiment (Best Mode)

The eleventh embodiment of an apparatus of the invention, given by way of non-limiting example and best mode of carrying out the invention, also corresponds to the portable apparatus for radio communication represented in FIG. 11, and all explanations provided for the tenth embodiment are applicable to this eleventh embodiment.

Figure 12:
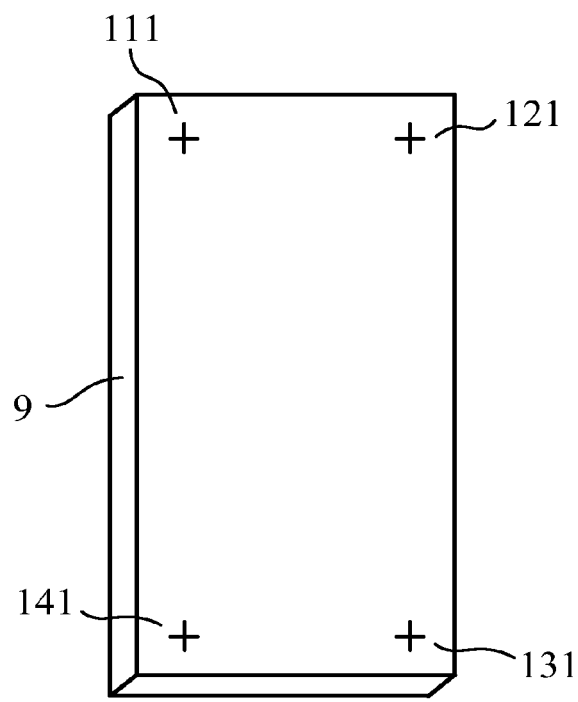
FIG. 12 shows the locations of the four antennas of a mobile phone.

In this eleventh embodiment, the apparatus for radio communication is a mobile phone. FIG. 12 is a drawing of a back view of the mobile phone (9). FIG. 12 shows the point (111) where the center of the first antenna (11) is located, the point (121) where the center of the second antenna (12) is located, the point (131) where the center of the third antenna (13) is located, and the point (141) where the center of the fourth antenna (14) is located.

Figure 13:
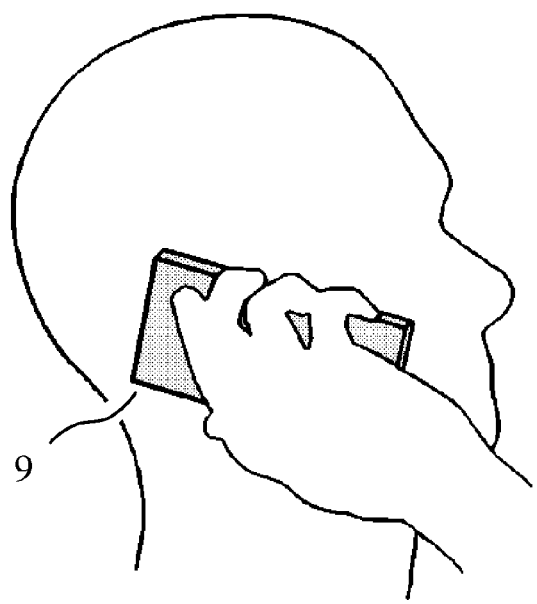
FIG. 13 shows a first typical use configuration (right hand and head configuration)
Figure 14:
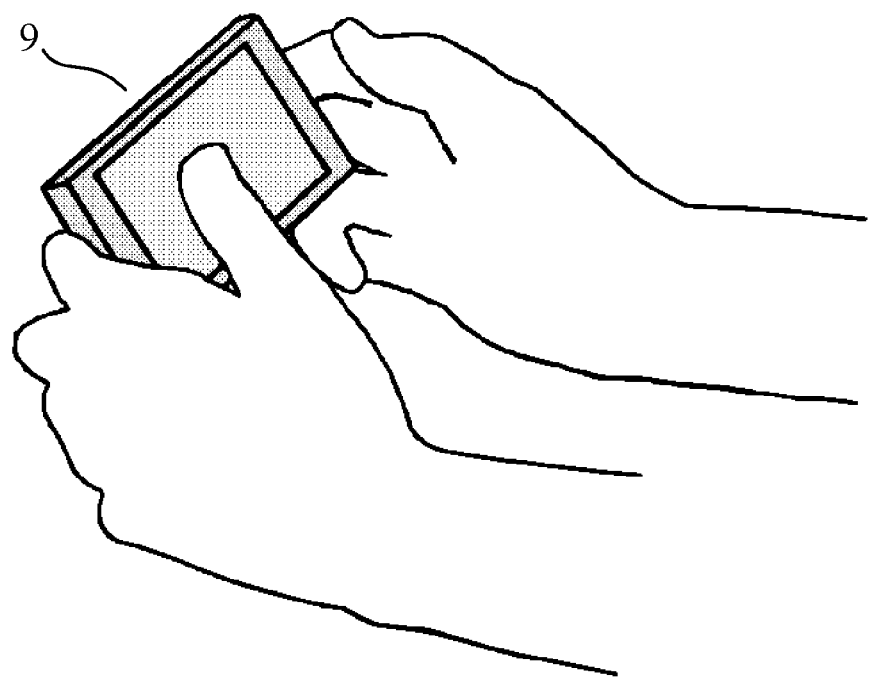
FIG. 14 shows a second typical use configuration (two hands configuration)
Figure 15:
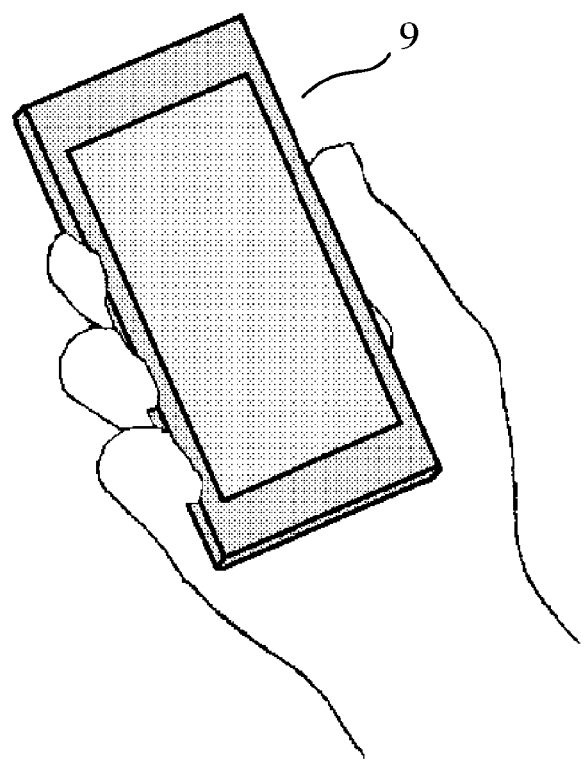
FIG. 15 shows a third typical use configuration (right hand only configuration)

A finite set of typical use configurations is defined. For instance, FIG. 13 shows a first typical use configuration, which may be referred to as the "right hand and head configuration"; FIG. 14 shows a second typical use configuration, which may be referred to as the "two hands configuration"; and FIG. 15 shows a third typical use configuration, which may be referred to as the "right hand only configuration". In FIG. 13, FIG. 14 and FIG. 15, the mobile phone (9) is held by the user. More precisely, the user holds the mobile phone close to his head using his right hand in FIG. 13; the user holds the mobile phone far from his head using both hands in FIG. 14; and the user holds the mobile phone far from his head using only his right hand in FIG. 15. In an actual use configuration, the localization variables assessed by a sensor installed near the point (111) where the center of the first antenna (11) is located, by a sensor installed near the point (121) where the center of the second antenna (12) is located, by a sensor installed near the point (131) where the center of the third antenna (13) is located, and by a sensor installed near the point (141) where the center of the fourth antenna (14) is located are used to determine the typical use configuration which is the closest to the actual use configuration. The specialist notes that the performance of two antennas selected among four antennas, as regards MIMO wireless communication, has been investigated for the three typical use configurations defined above, in said article of S. Zhang, K. Zhao, Z. Ying and S. He. However, the analysis of said article is not applicable to the present invention because the device studied in said article does not comprise a multiple-antenna-port and multiple-radio-port antenna tuning apparatus.

The configuration instruction is determined from a set of pre-defined configuration instructions that are stored in a lookup table realized in the processing unit, based on the closest typical use configuration and on the frequencies used for radio communication with the antennas. The specialist understands how to build and use such a lookup table. The specialist understands the advantage of defining and using a set of typical use configurations, which must be sufficiently large to cover all relevant cases, and sufficiently small to avoid an excessively large lookup table.

For instance, the tuning instruction may be a function of one or more quantities representative of a channel matrix, as explained in the eighth embodiment.

For instance, the tuning instruction may be a function of the localization variables and of one or more quantities representative of a channel matrix.

For instance, the tuning instruction may be a function of quantities depending on an impedance matrix presented by the radio ports, as explained in the ninth embodiment.

For instance, the tuning instruction may be a function of the localization variables and of quantities depending on an impedance matrix presented by the radio ports.

For instance, the tuning instruction may be determined from a set of pre-defined tuning instructions stored in a lookup table, based on the localization variables and on the frequencies used for radio communication with the antennas.

Twelfth Embodiment

The twelfth embodiment of a device of the invention, given by way of non-limiting example, also corresponds to the portable apparatus for radio communication represented in FIG. 11, and all explanations provided for the tenth embodiment are applicable to this twelfth embodiment.

In this twelfth embodiment, the configuration instruction and/or the tuning instruction are determined as a function of:
  the localization variables;
  the frequencies used for radio communication with the antennas;
  one or more additional variables, each of the additional variables lying in a set of additional variables, the elements of the set of additional variables comprising: communication type variables which indicate whether a radio communication session is a voice communication session, a data communication session or another type of communication session; a speakerphone mode activation indicator; a speaker activation indicator; variables obtained using one or more accelerometers; user identity variables which depend on the identity of the current user; reception quality variables which for instance include the quantities representative of a channel matrix of the eighth embodiment; and radio port variables which for instance include the real quantities depending on an impedance matrix presented by the radio ports of the ninth embodiment.

The elements of said set of additional variables may further comprise one or more variables which are different from the localization variables and which characterize the grip with which a user is holding the apparatus for radio communication.

In this twelfth embodiment, the configuration instruction and/or the tuning instruction may for instance be determined using a lookup table realized in the processing unit.

Based on the teachings of the patent of the U.S. Pat. No. 8,204,446 entitled "Adaptive Antenna Tuning Systems and Methods", the specialist understands that the antenna tuning obtained in this twelfth embodiment may be more accurate than an antenna tuning wherein the tuning instruction is only a function of the localization variables. The specialist also understands that the antenna tuning obtained in this twelfth embodiment may be simultaneously accurate and such that the tuning instruction is generated quickly and without requiring a large computational resource.

Thirteenth Embodiment

Figure 16:
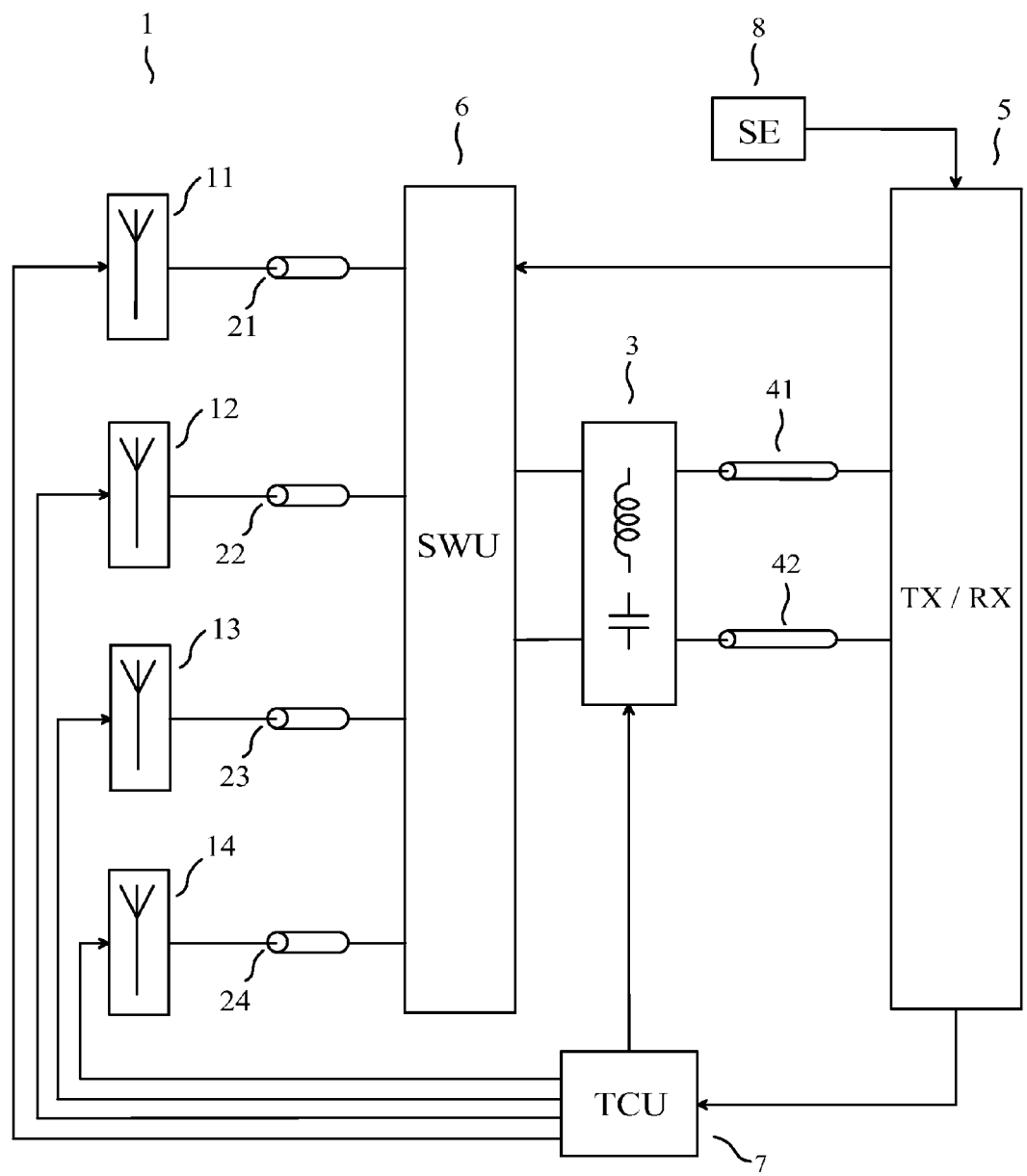
FIG. 16 shows a block diagram of a transceiver for radio communication of the invention, which simultaneously uses 2 selected antennas among 4 tunable passive antennas.

As a thirteenth embodiment of an apparatus of the invention, given by way of non-limiting example, we have represented in FIG. 16 the block diagram of a portable apparatus for radio communication in a given frequency band, the apparatus for radio communication being a transceiver comprising:
  N=4 antennas (11) (12) (13) (14), each of the N antennas being such that it can operate at any frequency in the given frequency band, the N antennas forming an antenna array (1), each of the antennas being a tunable passive antenna comprising at least one antenna control device, one or more characteristics of said tunable passive antenna being controlled using said at least one antenna control device, said at least one antenna control device having at least one parameter having an effect on said one or more characteristics, said at least one parameter being adjustable by electrical means;

a radio device (5) which consists of all parts of the apparatus for radio communication which are not shown elsewhere in FIG. 16;

a switching unit (6), the switching unit receiving a "configuration instruction" generated automatically within the apparatus for radio communication, the switching unit comprising N input ports each coupled to one and only one of the antennas through a feeder (21) (22) (23) (24), the switching unit comprising n=2 output ports, the switching unit operating in an active configuration determined by the configuration instruction, the active configuration being one of a plurality of allowed configurations, any one of the allowed configurations corresponding to a selection of n input ports among the N input ports, the switching unit providing, for any small signal in the given frequency band and for any one of the output ports, a bidirectional path between said any one of the output ports and one and only one input port of said selection of n input ports;

a sensor unit (8) estimating a plurality of localization variables;

an antenna tuning apparatus (3), the antenna tuning apparatus being a multiple-antenna-port and multiple-radio-port antenna tuning apparatus, the antenna tuning apparatus comprising n=2 antenna ports, each of the output ports being coupled to one and only one of the antenna ports, the antenna tuning apparatus comprising m=2 radio ports, each of the radio ports being coupled to the radio device (5) through an interconnection (41) (42), the antenna tuning apparatus comprising p adjustable impedance devices, where p is an integer greater than or equal to 2m, the p adjustable impedance devices being referred to as "the adjustable impedance devices of the antenna tuning apparatus" and being such that, at a frequency in said given frequency band, each of the adjustable impedance devices of the antenna tuning apparatus has a reactance, the reactance of any one of the adjustable impedance devices of the antenna tuning apparatus being adjustable by electrical means; and a tuning control unit (7), the tuning control unit receiving a "tuning instruction" generated automatically within the apparatus for radio communication, the tuning control unit delivering a plurality of "tuning control signals" to the antenna tuning apparatus and the tunable passive antennas, the tuning control signals being determined as a function of the tuning instruction, the reactance of each of the adjustable impedance devices of the antenna tuning apparatus being mainly determined by one or more of the tuning control signals, each of said parameters being mainly determined by one or more of the tuning control signals.

In the previous sentence, "each of said parameters" clearly means "each said at least one parameter of each said at least one antenna control device of each said tunable passive antenna".

This thirteenth embodiment may possibly use some aspects of the technique disclosed in the French patent application number 14/00666 of 20 Mar. 2014, entitled "Communication radio utilisant des antennes accordables et un appareil d'accord d'antenne", corresponding to the international application number PCT/IB2015/051644 of 6 Mar. 2015 entitled "Radio communication using tunable antennas and an antenna tuning apparatus".

INDICATIONS ON INDUSTRIAL APPLICATIONS

The invention is suitable for radio communication using multiple antennas. Thus, the invention is suitable for MIMO radio communication. The apparatus for radio communication may be an apparatus for MIMO radio communication, that is to say an apparatus for MIMO radio reception and/or an apparatus for MIMO radio emission.

The invention provides the best possible characteristics using very close antennas, hence presenting a strong interaction between the antennas. The invention is therefore particularly suitable for mobile apparatuses for radio communication, for instance mobile phones, tablet computers and portable computers.

The invention claimed is:

1. A method for radio communication by an apparatus including N antennas, the method comprising:
   generating, by a radio communication unit, a configuration instruction and a tuning instruction, and transmitting, by the radio communication unit, the configuration instruction to a switch and the tuning instruction to a tuner;
   selecting, by the switch comprising N input ports and n output ports, n antennas among the N antennas based on the configuration instruction, and providing, by the switch, a path between an output port of the selected n output ports and an input port of the N input ports, the input port being coupled to antennas of the n selected antennas, where N is an integer greater than or equal to 3, each of the N antennas to be operated at a frequency in a frequency band, n being an integer greater than or equal to 2 and less than or equal to N minus 1, each of the N input ports being coupled to one of the N antennas; and
   coupling, by an antenna tuning apparatus comprising n antenna ports, m radio ports and p adjustable impedance devices, the n output ports to the n antenna ports, where m is an integer greater than or equal to 2 and where p is an integer greater than or equal to 2m and each of the p adjustable impedance devices has a reactance being adjustable based on the tuning instruction received from the tuner.

2. The method of claim 1, wherein the path is a path between the output port of the n output ports and only one input port of the N input ports.

3. The method of claim 2, wherein the antenna tuning apparatus includes each of n antenna tuning apparatus units comprising one of the n antenna ports, one of the m radio ports, or at least two adjustable impedance devices.

4. The method of claim 2,
   wherein the tuning instruction comprises a function of one or more quantities indicating a channel matrix.

5. The method of claim 2,
   wherein the tuning instruction is a function of q real quantities based on an impedance matrix of the m radio ports, where q is an integer greater than or equal to m.

6. The method of claim 2, further comprising:
   estimating, by a localizer, a plurality of localization variables to determine the configuration instruction,
   wherein each of the localization variables is determined based on a distance between a part of a human body and a zone of the radio communication unit.

7. The method of claim 6, wherein the configuration instruction is determined from a set of pre-defined configuration instructions stored in a lookup table, based on the localization variables and on frequencies used for the radio communication with the N antennas.

8. The method of claim 1, wherein, when an impedance matrix of the n antenna ports is equal to a diagonal impedance matrix at the frequency in the frequency band, an impedance matrix of the m radio ports is determined based on a reactance of one of the p adjustable impedance devices.

9. The method claim 8, wherein at least one non-diagonal entry of the impedance matrix of the m radio ports is determined based on at least one reactance of the p adjustable impedance devices.

10. An apparatus comprising N antennas, the apparatus comprising:
the N antennas, where N is an integer greater than or equal to 3, each of the N antennas to be operated at a frequency in a frequency band;
at least one processor of a radio communication unit, configured to generate a configuration instruction and a tuning instruction, and transmit the configuration instruction to a switch and the tuning instruction to a tuner;
a switch comprising N input ports and n output ports, configured to select n antennas among the N antennas based on the configuration instruction, and provide a path between an output port of the selected n output ports and an input port of the N input ports, the input port being coupled to antennas of the n selected antennas, where n is an integer greater than or equal to 2 and less than or equal to N minus 1, each of the N input ports being coupled to one of the N antennas; and
an antenna tuning apparatus comprising n antenna ports, m radio ports and p adjustable impedance devices, configured to couple the n output ports to the n antenna ports, where m is an integer greater than or equal to 2, p is an integer greater than or equal to 2m, each of the p adjustable impedance devices has a reactance being adjustable based on the tuning instruction received from the tuner,
wherein the tuner is configured to:
receive the tuning instruction from the at least one processor, and transmit the tuning instruction to the antenna tuning apparatus.

11. The apparatus of claim 10, wherein the path is a path between the output port of the n output ports only one input port of the N input ports.

12. The apparatus of claim 11, wherein at least one non-diagonal entry of the impedance matrix of the m radio ports is determined based on at least one reactance of the p adjustable impedance devices.

13. The apparatus of claim 12, wherein at least one non-diagonal entry of the impedance matrix of the m radio ports is determined based on at least one reactance of the p adjustable impedance devices.

14. The apparatus of claim 11, wherein the antenna tuning apparatus each of n antenna tuning apparatus units comprising one of the n antenna ports, one of the m radio ports, or at least two adjustable impedance devices.

15. The apparatus of claim 11, wherein the tuning instruction comprises a function of one or more quantities indicating a channel matrix.

16. The apparatus of claim 11, wherein the tuning instruction being a function of q real quantities based on an impedance matrix of the m radio ports, where q is an integer greater than or equal to m.

17. The apparatus of claim 11, further comprising:
a localizer configured to estimate a plurality of localization variables to determine the configuration instruction,
wherein each of the localization variables is determined based on a distance between a part of a human body and a zone of the radio communication unit.

18. The apparatus of claim 17, wherein the configuration instruction is determined from a set of pre-defined configuration instructions stored in a lookup table, based on the localization variables and on the frequencies used for radio communication with the N antennas.

* * * * *